(12) United States Patent
Yang et al.

(10) Patent No.: US 11,862,249 B2
(45) Date of Patent: Jan. 2, 2024

(54) NON-VOLATILE MEMORY WITH STAGGERED RAMP DOWN AT THE END OF PRE-CHARGING

(71) Applicant: SANDISK TECHNOLOGIES LLC, Addison, TX (US)

(72) Inventors: Xiang Yang, Santa Clara, CA (US);
Fanqi Wu, Sunnyvale, CA (US);
Jiacen Guo, Sunnyvale, CA (US);
Jiahui Yuan, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 147 days.

(21) Appl. No.: 17/527,747

(22) Filed: Nov. 16, 2021

(65) Prior Publication Data

US 2023/0154538 A1 May 18, 2023

(51) Int. Cl.
| | | |
|---|---|---|
| *G11C 16/04* | (2006.01) | |
| *G11C 16/10* | (2006.01) | |
| *G11C 16/08* | (2006.01) | |
| *G11C 16/34* | (2006.01) | |
| *G11C 16/24* | (2006.01) | |
| *H10B 43/27* | (2023.01) | |

(Continued)

(52) U.S. Cl.
CPC .......... *G11C 16/10* (2013.01); *G11C 16/0483* (2013.01); *G11C 16/08* (2013.01); *G11C 16/24* (2013.01); *G11C 16/3427* (2013.01); *H10B 43/27* (2023.02); *G11C 11/5671* (2013.01); *H01L 25/0657* (2013.01); *H01L 2225/06562* (2013.01); *H10B 43/10* (2023.02)

(58) Field of Classification Search
CPC ..... G11C 16/10; G11C 16/0483; G11C 16/08; G11C 16/24; G11C 16/3427; G11C 11/5671; H10B 43/27; H10B 43/10; H01L 25/0657; H01L 2225/06562
USPC ..................................................... 365/185.17
See application file for complete search history.

(56) References Cited

U.S. PATENT DOCUMENTS

| | | | |
|---|---|---|---|
| 7,218,552 B1 * | 5/2007 | Wan ..................... | G11C 16/349 |
| | | | 365/185.17 |
| 9,412,463 B1 * | 8/2016 | Chen ..................... | G11C 16/26 |
| | | (Continued) | |

OTHER PUBLICATIONS

PCT International Search Report and Written Opinion dated Oct. 17, 2022, PCT Patent Application No. PCT/US2022/029343.

*Primary Examiner* — Tha-O H Bui
(74) *Attorney, Agent, or Firm* — Vierra Magen Marcus LLP

(57) ABSTRACT

In order to inhibit memory cells from programming and mitigate program disturb, the memory pre-charges channels of NAND strings connected to a common set of control lines by applying positive voltages to the control lines and applying voltages to a source line and bit lines connected to the NAND strings. The control lines include word lines and select lines. The word lines include an edge word line. The memory ramps down the positive voltages applied to the control lines, including ramping down control lines on a first side of the edge word line, ramping down the edge word line, and performing a staggered ramp down of three or more control lines on a second side of the edge word line. After the pre-charging, unselected NAND strings have their channel boosted to prevent programming and selected NAND strings experience programming on selected memory cells.

20 Claims, 23 Drawing Sheets

(51) Int. Cl.
  *G11C 11/56* (2006.01)
  *H01L 25/065* (2023.01)
  *H10B 43/10* (2023.01)

(56) References Cited

U.S. PATENT DOCUMENTS

| | | |
|---|---|---|
| 9,620,233 B1 | 4/2017 | Dong |
| 9,887,002 B1 | 2/2018 | Zhang |
| 10,276,248 B1 | 4/2019 | Lu |
| 10,297,323 B2 | 5/2019 | Yu |
| 10,643,718 B2 * | 5/2020 | Zhao .................. G11C 16/3427 |
| 10,957,394 B1 | 3/2021 | Chen |
| 2015/0221385 A1 | 8/2015 | Ahn et al. |
| 2016/0336071 A1 | 11/2016 | Park et al. |
| 2017/0076814 A1 * | 3/2017 | Hashimoto ............ H10B 43/27 |
| 2017/0117049 A1 | 4/2017 | Rajwade et al. |
| 2019/0295669 A1 | 9/2019 | Yang et al. |
| 2021/0264964 A1 | 8/2021 | Puthenthermadam et al. |

* cited by examiner

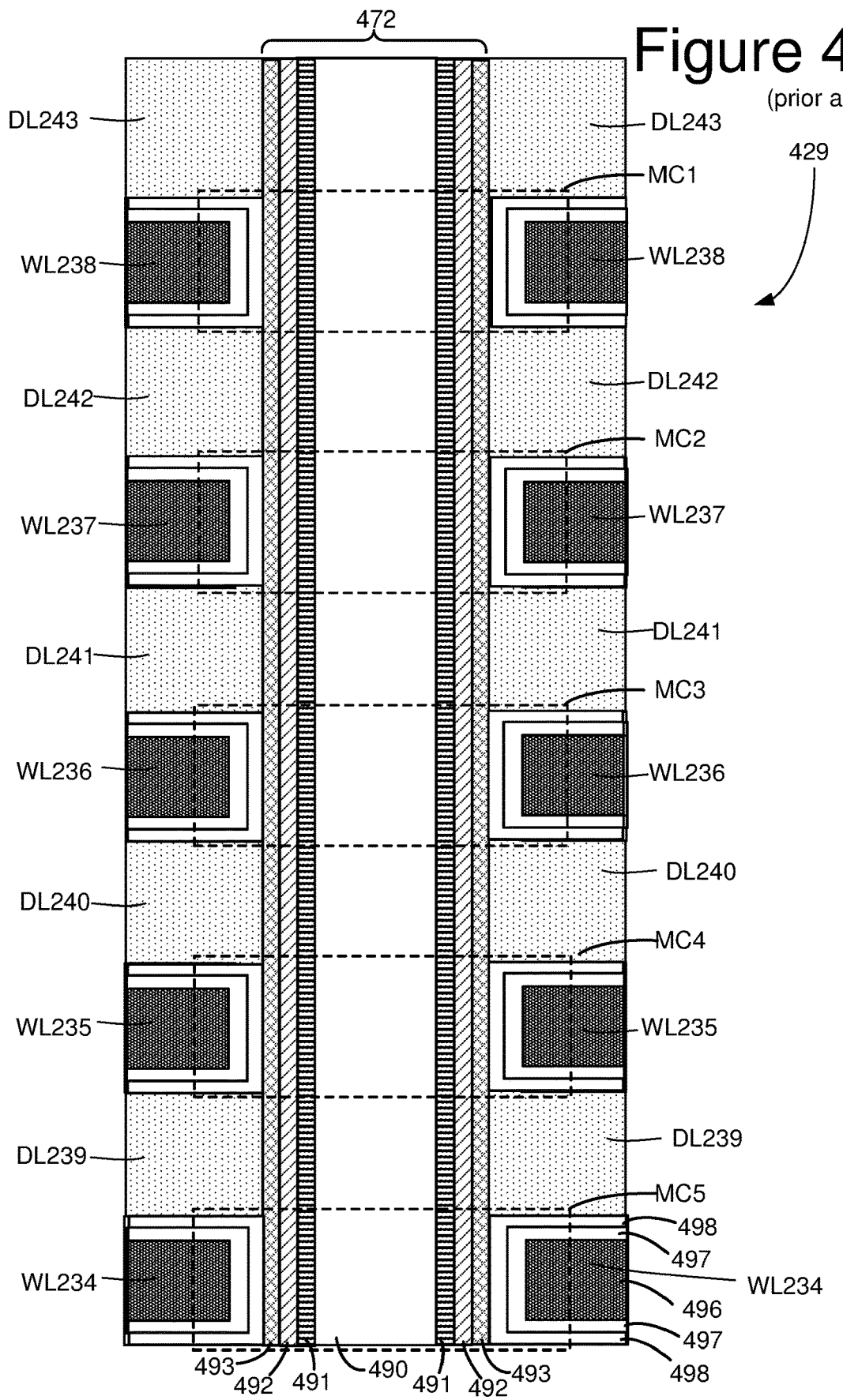

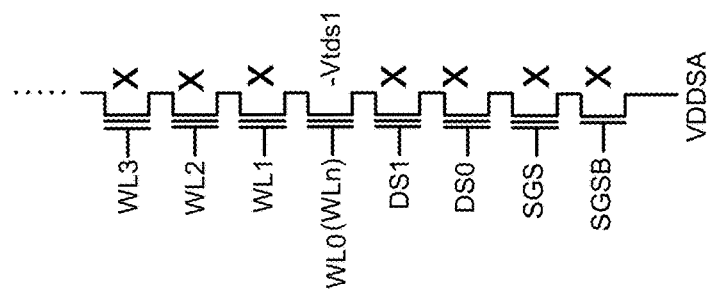
Figure 7D (time=t5)
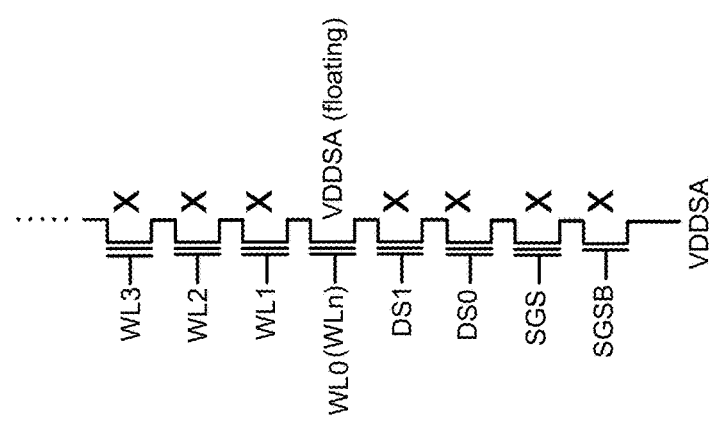
Figure 7C (time=t4)
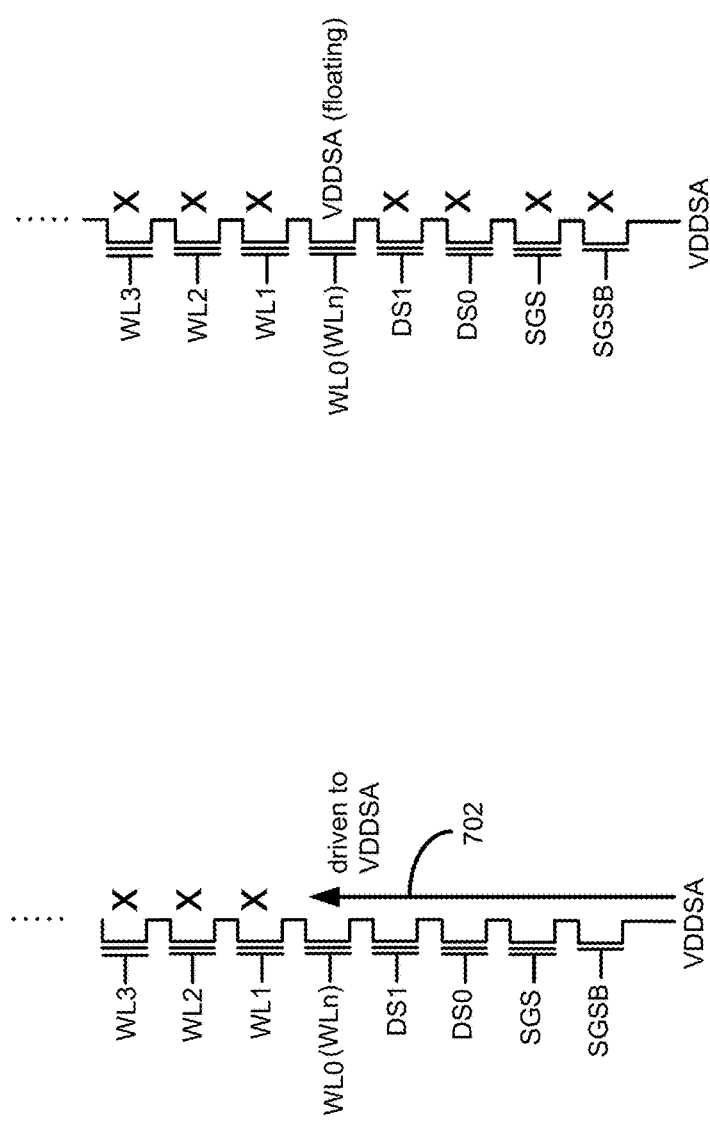
Figure 7B (time=t2)

Figure 8

| pre-charge a channel of a group of connected non-volatile memory cells by applying voltages to the control lines connected to the group of connected non-volatile memory cells, the control lines comprise word lines and select lines, the word lines include an edge word line, the control lines include a first control line next to the edge word line and a second control line next to the first control line | ~ 802 |

↓

| ramp down the voltages applied to the control lines for the pre-charging, including ramping down the first control line prior to ramping down the second control line | ~ 804 |

Figure 9

| pre-charge a channel of a group of connected non-volatile memory cells by applying voltages to the control lines connected to the group of connected non-volatile memory cells; the control lines comprise word lines and select lines; the word lines include an edge word line; the control lines include: a first control line next to the edge word line, a second control line next to the first control line, a third control line next to the second control line, and a fourth control line next to the third control line | ~ 902 |

↓

| ramp down the voltages applied to the control lines for the pre-charging including ramping down the first control line prior to ramping down the second control line, ramping down the second control line prior to ramping down the third control line and ramping down the third control line prior to ramping down the fourth control line | ~ 904 |

Figure 10 pre-charging channels of NAND strings connected to a common set of control lines by applying positive voltages to the control lines and applying voltages to a source line and bit lines connected to the NAND strings, the control lines include word lines and select lines, the word lines include an edge word line — 1002 ramping down the positive voltages applied to the control lines, the ramping down comprising

- 1042 ramping down control lines on a first side of the edge word line

- 1044 ramping down the edge word line

- 1046 performing a staggered ramp down of at least three control lines on a second side of the edge word line

— 1004

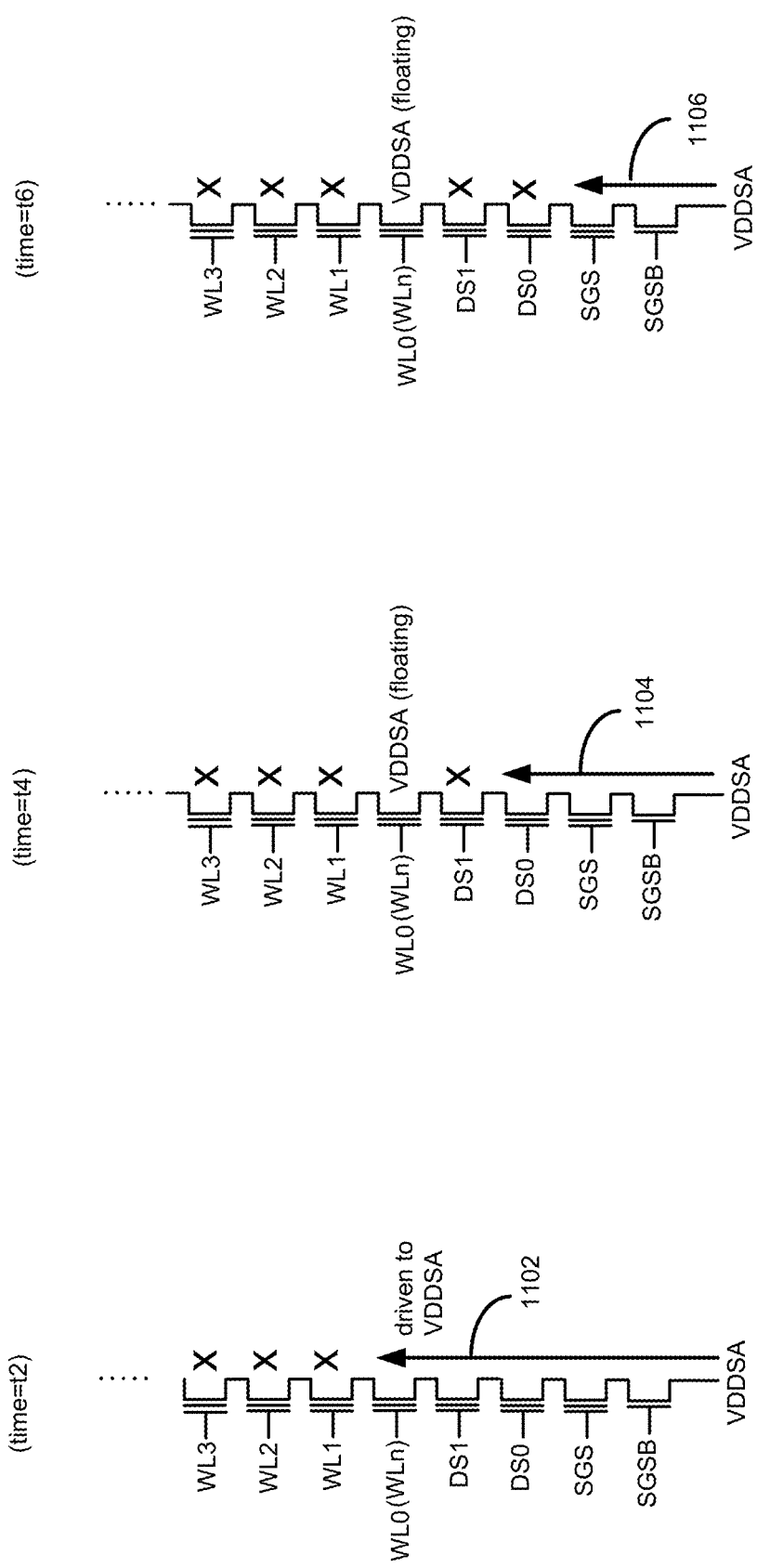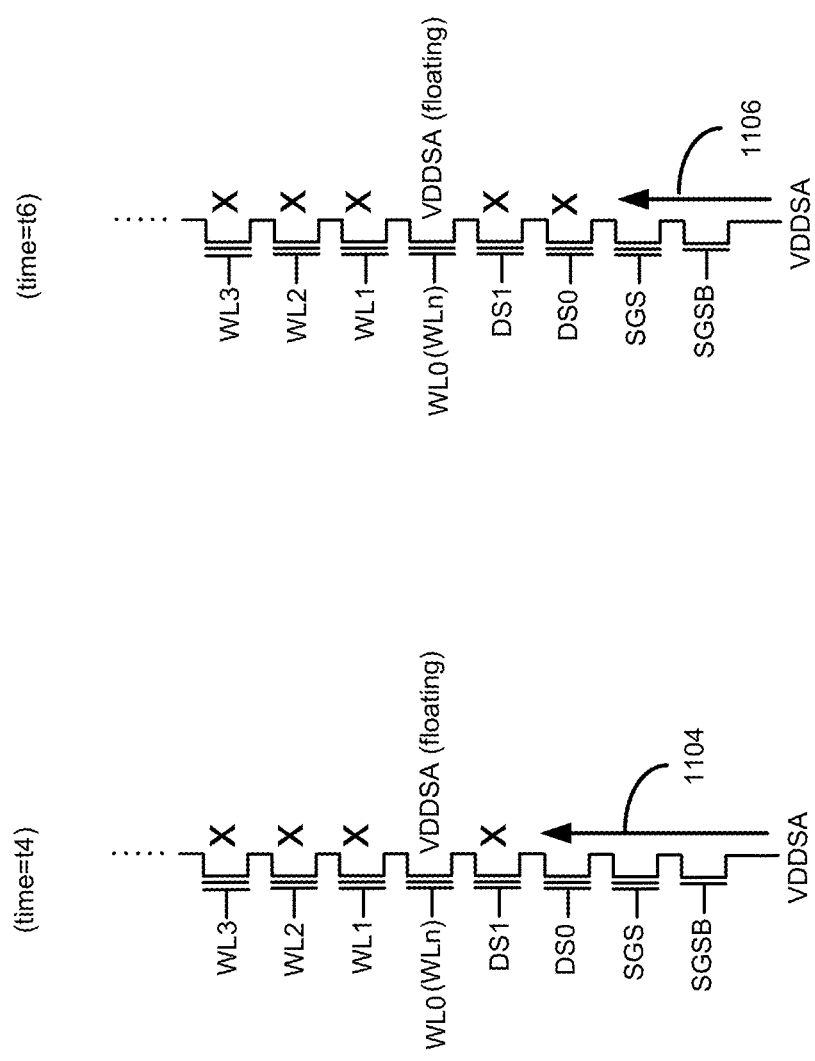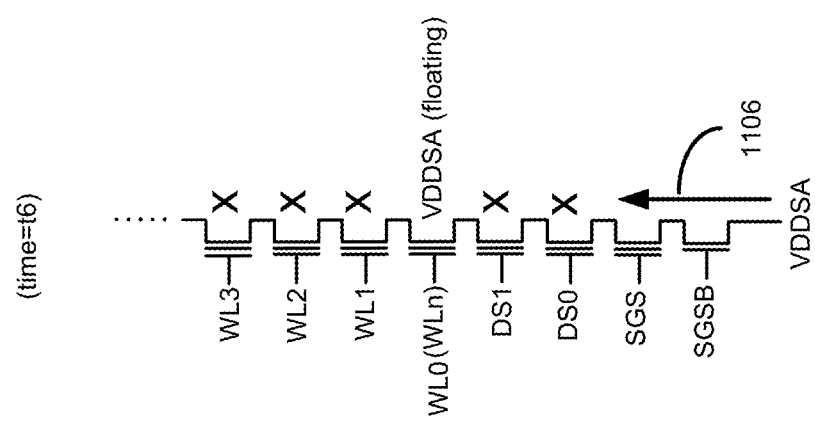

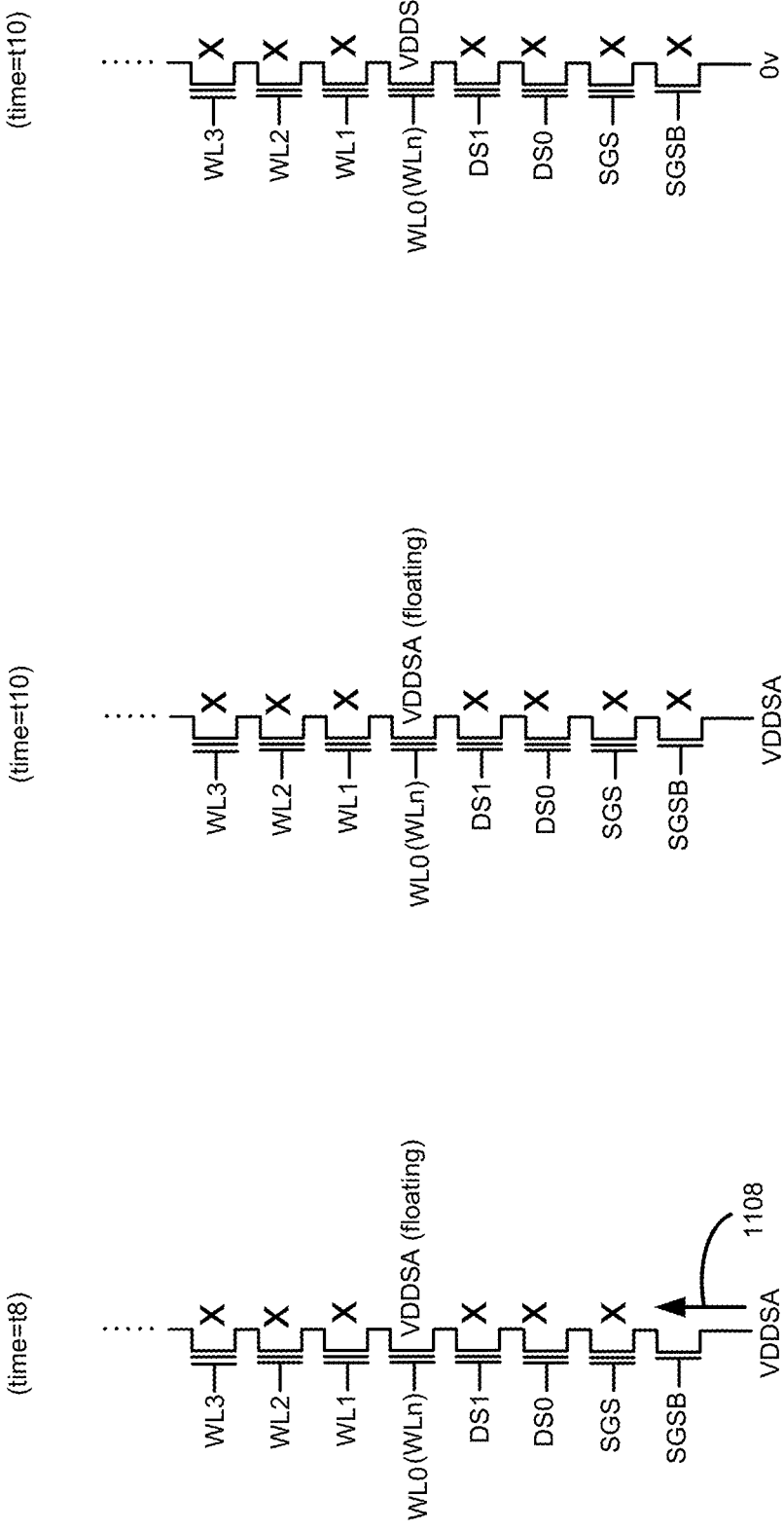
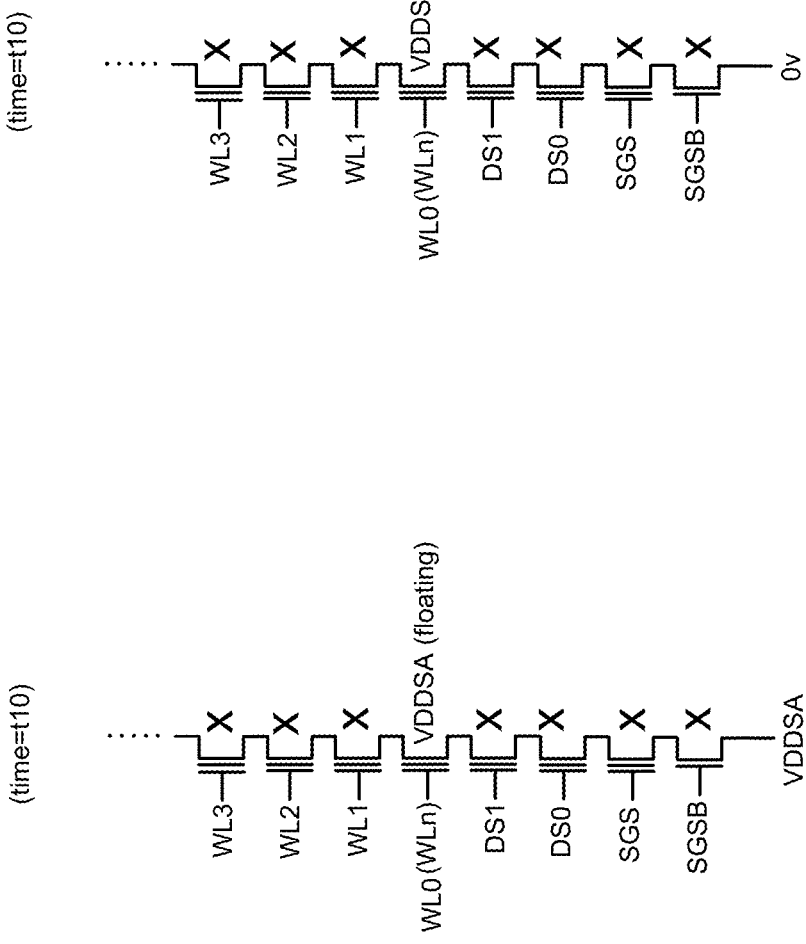
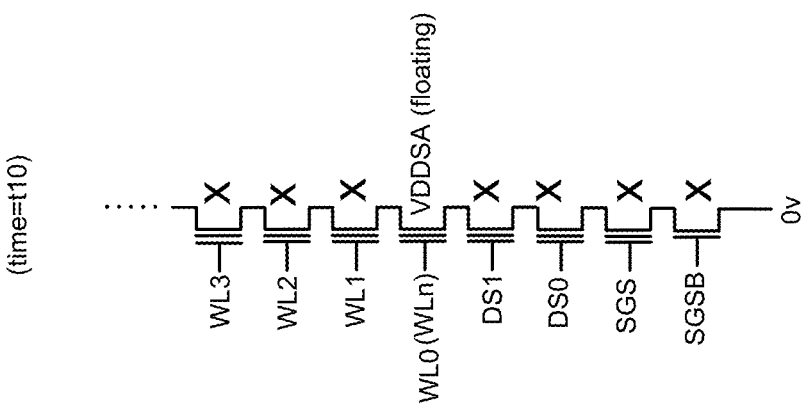

ered ramp down of voltages at the end of pre-charging in order to prevent program disturb and maintain narrow threshold voltage distributions for programmed memory cells in order to prevent errors in the data being stored. The memory pre-charges channels of NAND strings connected to a common set of control lines by applying positive voltages to the control lines, a source line, and bit lines connected to the NAND strings. The control lines include word lines and select lines. The word lines include an edge word line. The memory ramps down the positive voltages applied to the control lines, including ramping down control lines on a first side of the edge word line, ramping down the edge word line, and performing a staggered ramp down of three or more control lines on a second side of the edge word line. After the pre-charging, unselected NAND strings have their channel boosted to prevent programming and selected NAND strings experience programming on selected memory cells.

NON-VOLATILE MEMORY WITH STAGGERED RAMP DOWN AT THE END OF PRE-CHARGING

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). One example of non-volatile memory is flash memory (e.g., NAND-type and NOR-type flash memory).

Users of non-volatile memory can program (i.e., write) data to the non-volatile memory and later read that data back. For example, a digital camera may take a photograph and store the photograph in non-volatile memory. Later, a user of the digital camera may view the photograph by having the digital camera read the photograph from the non-volatile memory. Because users often rely on the data they store, it is important to users of non-volatile memory to be able to store data reliably so that it can be read back successfully.

BRIEF DESCRIPTION OF THE DRAWINGS

Like-numbered elements refer to common components in the different figures.

FIG. 4D is a cross sectional view of one embodiment of a vertical column of memory cells.

FIGS. 7B, 7C and 7D depict a portion of a NAND string at different times during the process of FIG. 7A.

FIG. 8 Is a flow chart describing one embodiment of a process for pre-charging NAND strings as part of the programming process.

FIG. 9 Is a flow chart describing one embodiment of a process for pre-charging NAND strings as part of the programming process.

FIG. 10 Is a flow chart describing one embodiment of a process for pre-charging NAND strings as part of the programming process.

FIG. 11B-G a portion of a NAND string at different times during the process of FIG. 7A.

DETAILED DESCRIPTION

A system is disclosed that staggers the ramping down of voltages at the end of pre-charging in order to prevent program disturb and maintain narrow threshold voltage distributions for programmed memory cells in order to prevent errors in the data being stored. The memory pre-charges channels of NAND strings connected to a common set of control lines by applying positive voltages to the control lines, a source line, and bit lines connected to the NAND strings. The control lines include word lines and select lines. The word lines include an edge word line. The memory ramps down the positive voltages applied to the control lines, including ramping down control lines on a first side of the edge word line, ramping down the edge word line, and performing a staggered ramp down of three or more control lines on a second side of the edge word line. After the pre-charging, unselected NAND strings have their channel boosted to prevent programming and selected NAND strings experience programming on selected memory cells.

Figure 1:
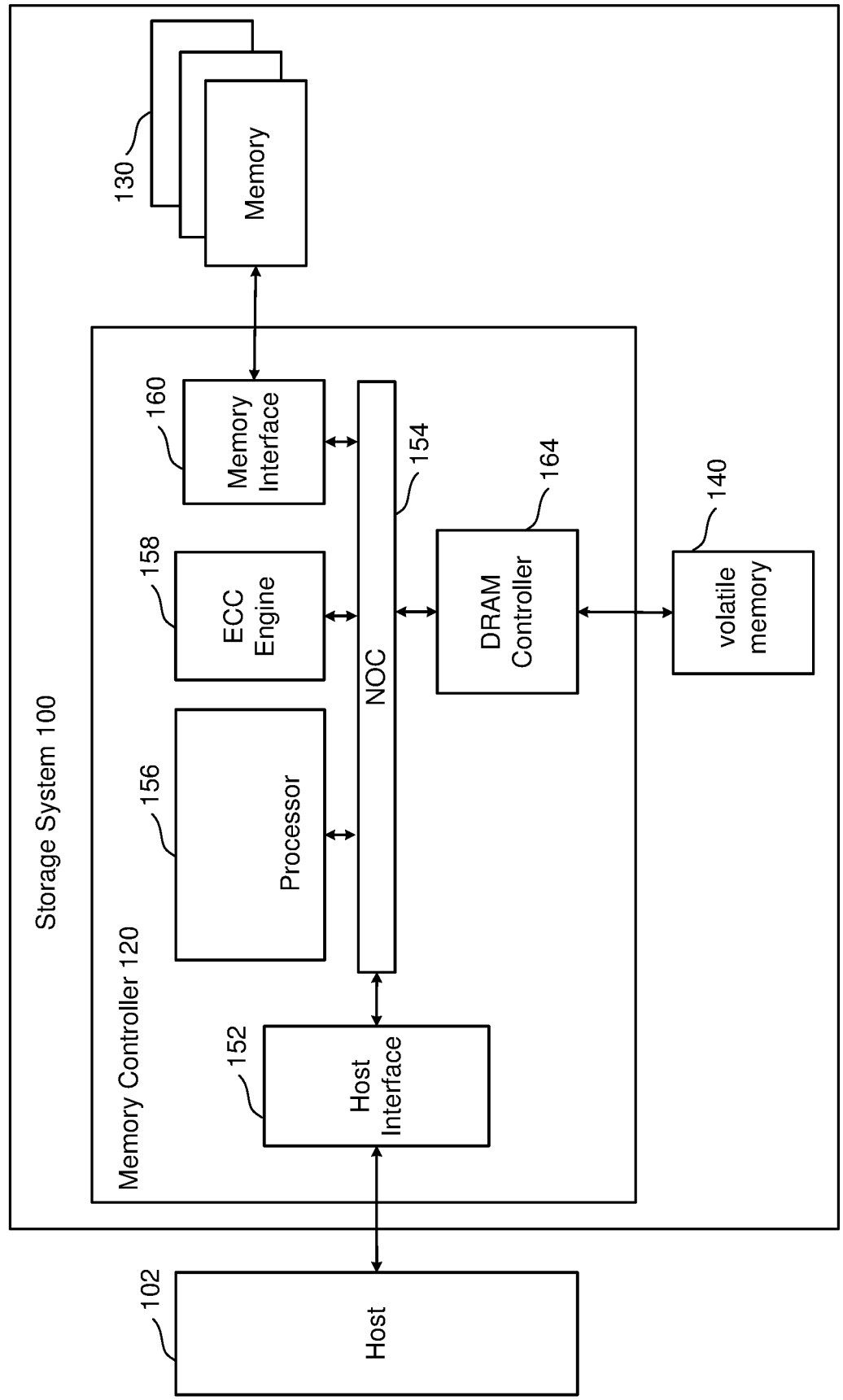
FIG. 1 is a block diagram depicting one embodiment of a storage system.

FIG. 1 is a block diagram of one embodiment of a storage system 100 that implements the proposed technology described herein. In one embodiment, storage system 100 is a solid state drive ("SSD"). Storage system 100 can also be a memory card, USB drive or other type of storage system. The proposed technology is not limited to any one type of memory system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 connected to non-volatile memory 130 and local high speed volatile memory 140 (e.g., DRAM). Local high speed volatile memory 140 is used by memory controller 120 to perform certain functions. For example, local high speed volatile memory 140 stores logical to physical address translation tables ("L2P tables").

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with non-volatile memory 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
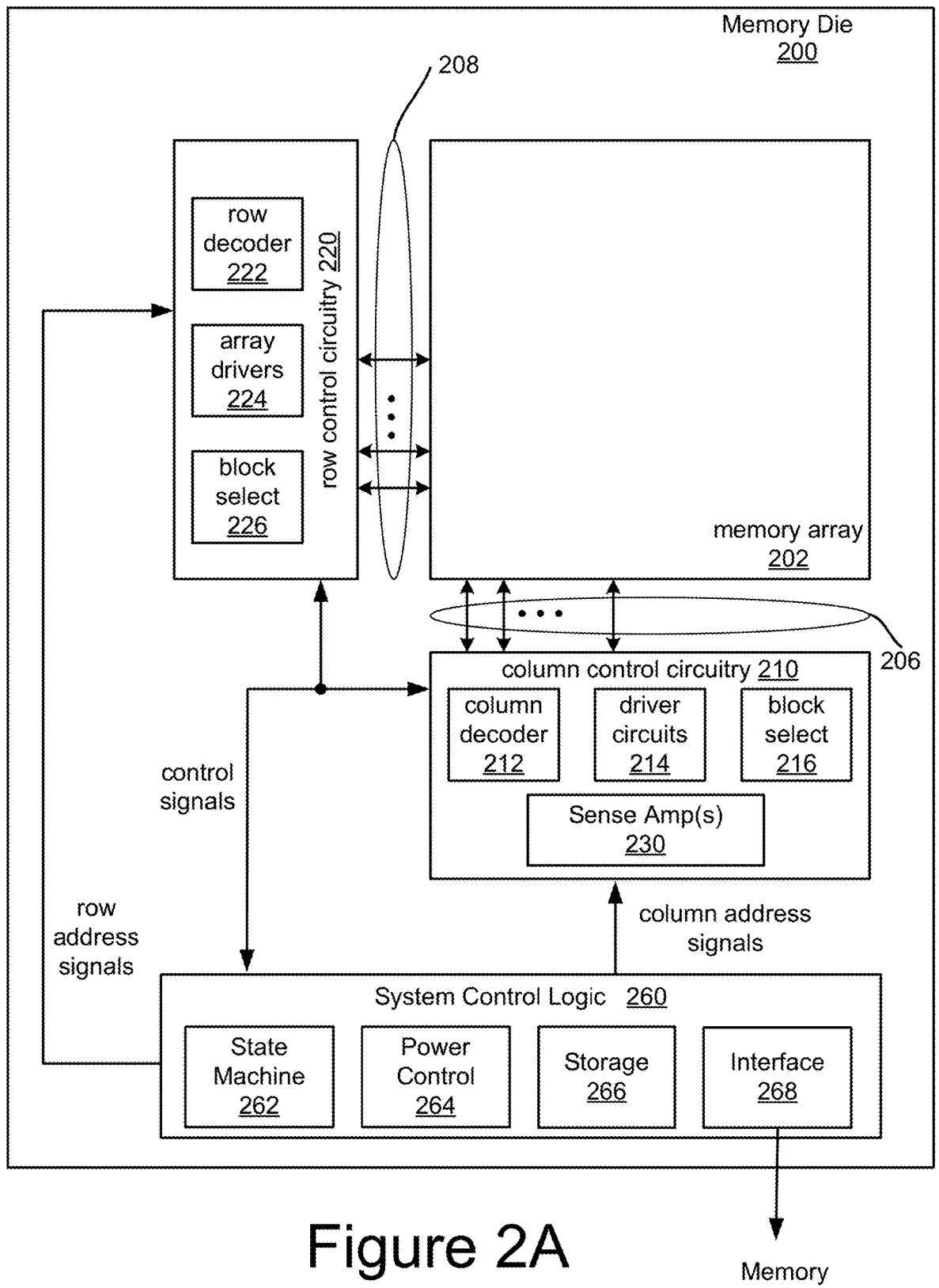
FIG. 2A is a block diagram of one embodiment of a memory die.

In one embodiment, non-volatile memory 130 comprises one or more memory die. FIG. 2A is a functional block diagram of one embodiment of a memory die 200 that comprises non-volatile memory 130. Each of the one or more memory die of non-volatile memory 130 can be implemented as memory die 200 of FIG. 2A. The components depicted in FIG. 2A are electrical circuits. Memory die 200 includes a memory array 202 that can comprise non-volatile memory cells, as described in more detail below. The array terminal lines of memory array 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory array 202. Row control circuitry 220 receives a group of M row address signals and one or more various control signals from System Control Logic circuit 206, and typically may include such circuits as row decoders 222, array terminal drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory array 202. Although only single block is shown for array 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 262 can also include a power control module 264 that controls the power and voltages supplied to the rows and columns of the memory structure 202 during memory operations and may include charge pumps and regulator circuit for creating regulating voltages. System control logic 262 includes storage 366 (e.g., RAM, registers, latches, etc.), which may be used to store parameters for operating the memory array 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all the components depicted in FIG. 2A other than memory structure 202. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
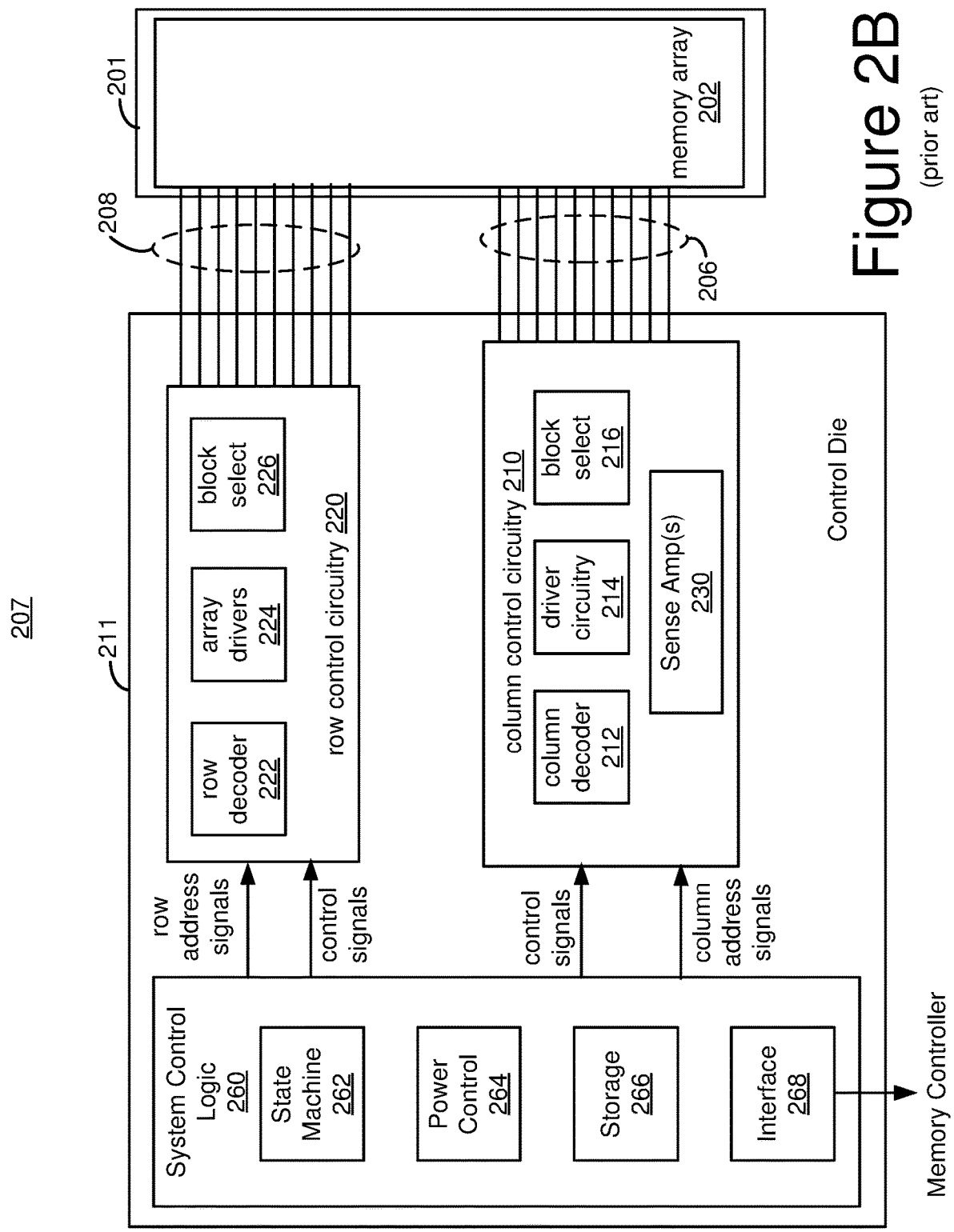
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile memory 130 of storage system 100. The integrated memory assembly 207 includes two types of semiconductor die (or more succinctly, "die"). Memory die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory die 201. In some embodiments, the memory die 201 and the control die 211 are bonded together.

FIG. 2B shows an example of the peripheral circuitry, including control circuits, formed in a peripheral circuit or control die 211 coupled to memory structure 202 formed in memory die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory die 201. In some embodiments, some of the circuitry in the system control logic 260 is located on the on the memory die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory 2 die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory structure 202 on the memory die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory die 201, which are connected to bit lines of memory structure 202. Each bit line of memory structure 202 may have a corresponding electrical path in electrical paths 306, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory die 201.

For purposes of this document, the phrases "a control circuit" or "one or more control circuits" can include any one of or any combination of memory controller 120, state machine 262, all or a portion of system control logic 260, all or a portion of row control circuitry 220, all or a portion of column control circuitry 210, a microcontroller, a microprocessor, and/or other similar functioned circuits. The control circuit can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Figure 3A:
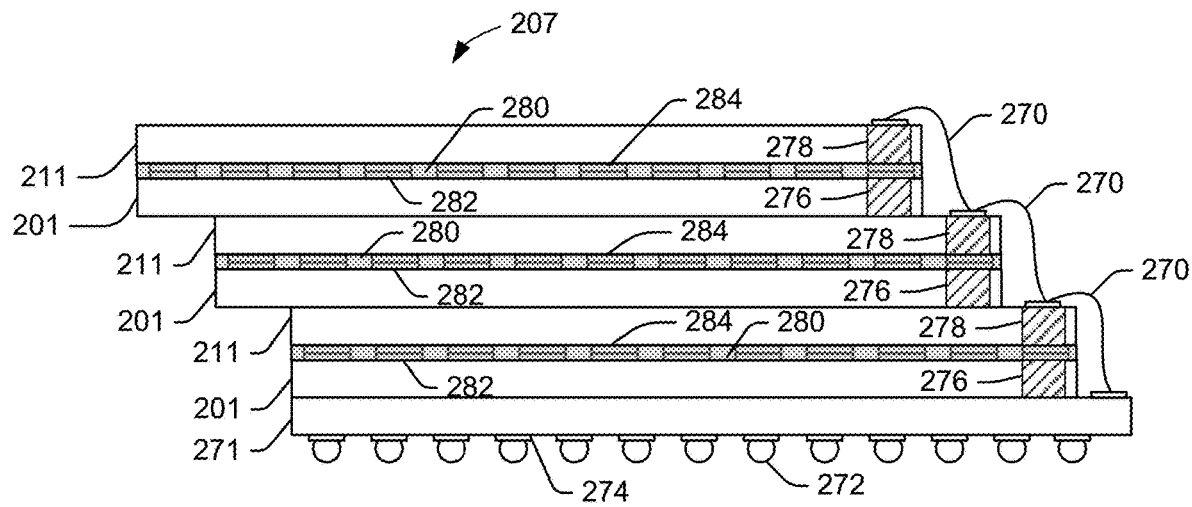
FIGS. 3A and 3B depict different embodiments of integrated memory assemblies.

In some embodiments, there is more than one control die 211 and more than one memory die 201 in an integrated memory assembly 207. In some embodiments, the integrated memory assembly 207 includes a stack of multiple control die 211 and multiple memory die 201. FIG. 3A depicts a side view of an embodiment of an integrated memory assembly 207 stacked on a substrate 271 (e.g., a stack comprising control dies 211 and memory dies 201). The integrated memory assembly 207 has three control dies 211 and three memory dies 201. In some embodiments, there are more than three memory dies 201 and more than three control die 211.

Each control die 211 is affixed (e.g., bonded) to at least one of the memory dies 201. Some of the bond pads 282/284 are depicted. There may be many more bond pads. A space between two dies 201, 211 that are bonded together is filled with a solid layer 280, which may be formed from epoxy or other resin or polymer. This solid layer 280 protects the electrical connections between the dies 201, 211, and further secures the dies together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
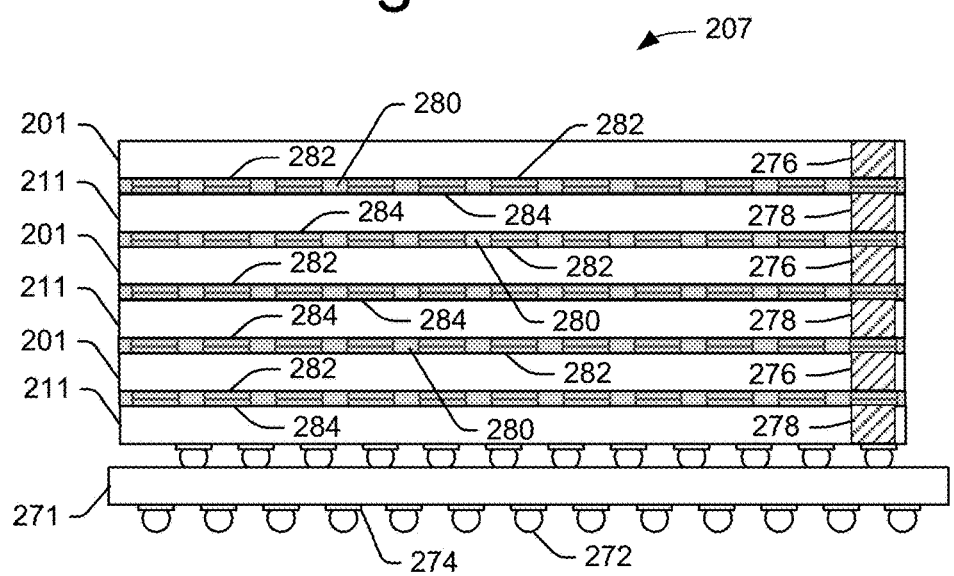

FIG. 3B depicts a side view of another embodiment of an integrated memory assembly 207 stacked on a substrate 271. The integrated memory assembly 207 of FIG. 3B has three control die 211 and three memory die 201. In some embodiments, there are many more than three memory dies 201 and many more than three control dies 211. In this example, each control die 211 is bonded to at least one memory die 201. Optionally, a control die 211 may be bonded to two or more memory die 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory die 201 may be bonded together. Bond pads on each die 201, 211 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 201, 211. Where no such film is initially provided, a space between the dies may be under filled with an epoxy or other resin or polymer. The under-fill material may be applied as a liquid which then hardens into a solid layer. This under-fill step protects the electrical connections between the dies 201, 211, and further secures the dies together. Various materials may be used as under-fill material, but in embodiments, it may be Hysol epoxy resin from Henkel Corp., having offices in California, USA.

Figure 4:
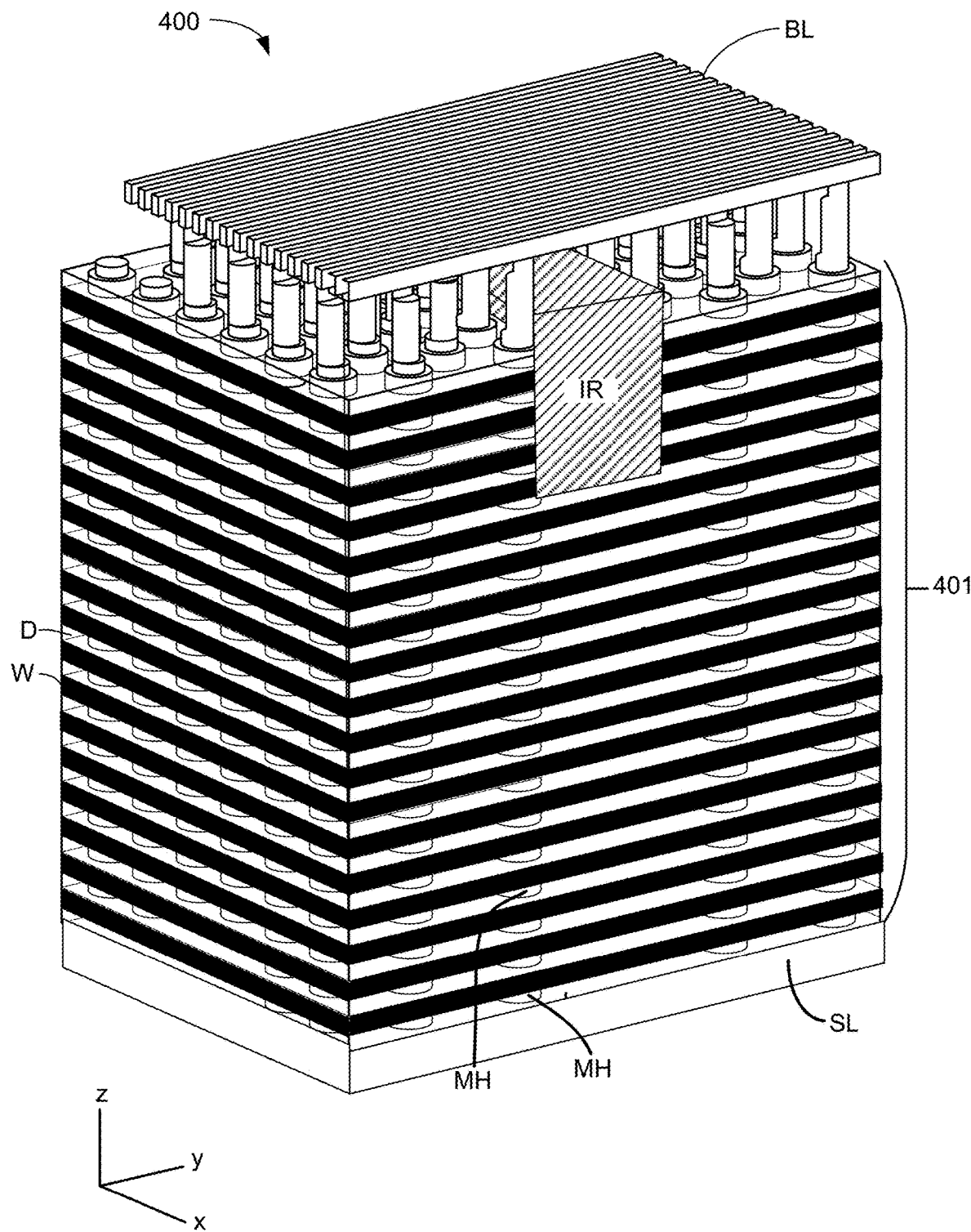
FIG. 4 is a perspective view of a portion of one embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example, one of the dielectric layers is marked as D and one of the conductive layers (also called word line layers) is marked as W. The number of alternating dielectric layers and conductive layers can vary based on specific implementation requirements. As will be explained below, in one embodiment the alternating dielectric layers and conductive layers are divided into six (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
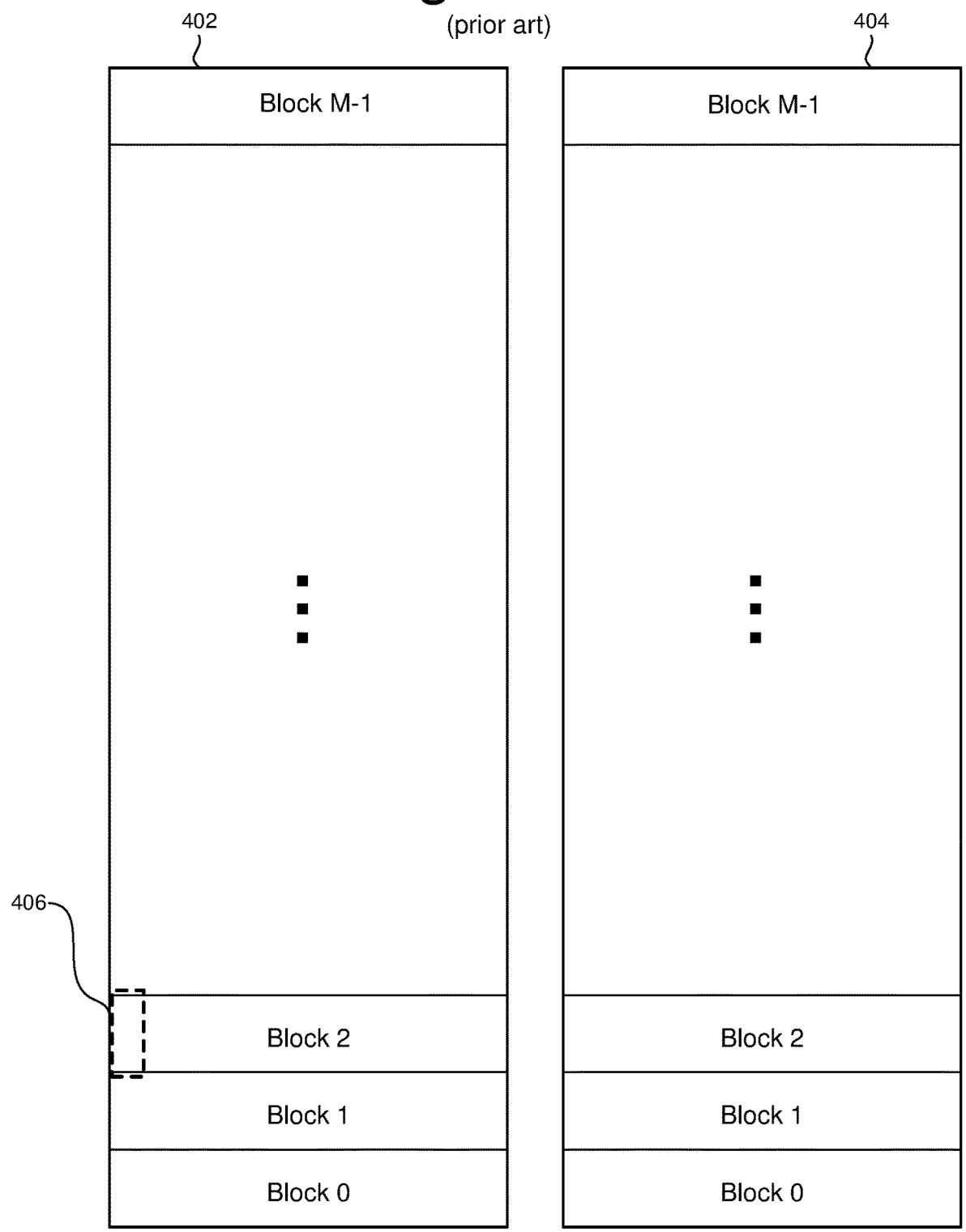
FIG. 4A is a block diagram of one embodiment of a memory structure having two planes.

FIG. 4A is a block diagram explaining one example organization of memory structure 202, which is divided into two planes 402 and 404. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all the vertical NAND strings for that block. Although FIG. 4A shows two planes 402/404, more or less than two planes can be implemented. In some embodiments, memory structure 202 includes eight planes.

Figure 4B:
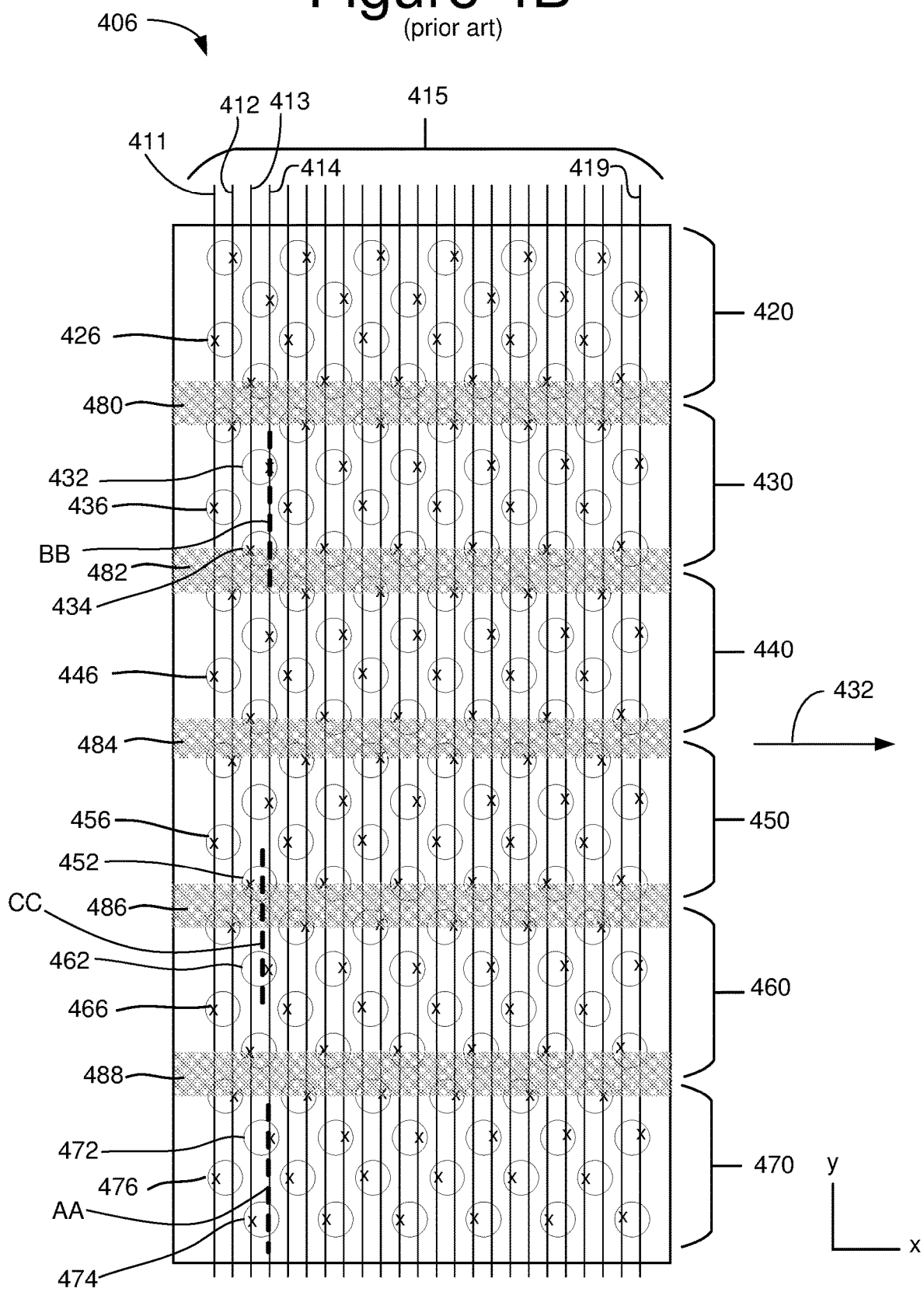
FIG. 4B depicts a top view of a portion of one embodiment of a block of memory cells.

FIGS. 4B-4F depict an example three dimensional ("3D") NAND structure that corresponds to the structure of FIG. 4 and can be used to implement memory structure 202 of FIGS. 2A and 2B. FIG. 4B is a block diagram depicting a top view of a portion 406 of Block 2 of plane 402. As can be seen from FIG. 4B, the block depicted in FIG. 4B extends in the direction of 432. In one embodiment, the memory array has many layers; however, FIG. 4B only shows the top layer.

FIG. 4B depicts a plurality of circles that represent the vertical columns, which correspond to the memory holes. Each of the vertical columns include multiple select transistors (also referred to as a select gate or selection gate) and multiple memory cells. In one embodiment, each vertical column implements a NAND string. For example, FIG. 4B labels a subset of the vertical columns/NAND strings 426, 432, 436, 446, 456, 462, 466, 472, 474 and 476.

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 411 is connected to vertical columns 426, 436, 446, 456, 466 and 476.

The block depicted in FIG. 4B includes a set of isolation regions 480, 482, 484, 486 and 488, which are formed of $SiO_2$; however, other dielectric materials can also be used. Isolation regions 480, 482, 484, 486 and 488 serve to divide the top layers of the block into six regions; for example, the top layer depicted in FIG. 4B is divided into regions 420, 430, 440, 450, 460 and 470 all of which are referred to as sub-blocks. In one embodiment, the isolation regions only divide the layers used to implement select gates so that NAND strings in different sub-blocks can be independently selected. In one example implementation, a bit line only connects to one vertical column/NAND string in each of regions (sub-blocks) 420, 430, 440, 450, 460 and 470. In that implementation, each block has twenty four rows of active columns and each bit line connects to six rows in each block. In one embodiment, all of the six vertical columns/NAND strings connected to a common bit line are connected to the same word line (or set of word lines); therefore, the system uses the drain side selection lines to choose one (or another subset) of the six to be subjected to a memory operation (program, verify, read, and/or erase).

Although FIG. 4B shows each region 420, 430, 440, 450, 460 and 470 having four rows of vertical columns, six regions and twenty four rows of vertical columns in a block, those exact numbers are an example implementation. Other embodiments may include more or less regions per block, more or less rows of vertical columns per region and more or less rows of vertical columns per block. FIG. 4B also shows the vertical columns being staggered. In other embodiments, different patterns of staggering can be used. In some embodiments, the vertical columns are not staggered.

Figure 4C:
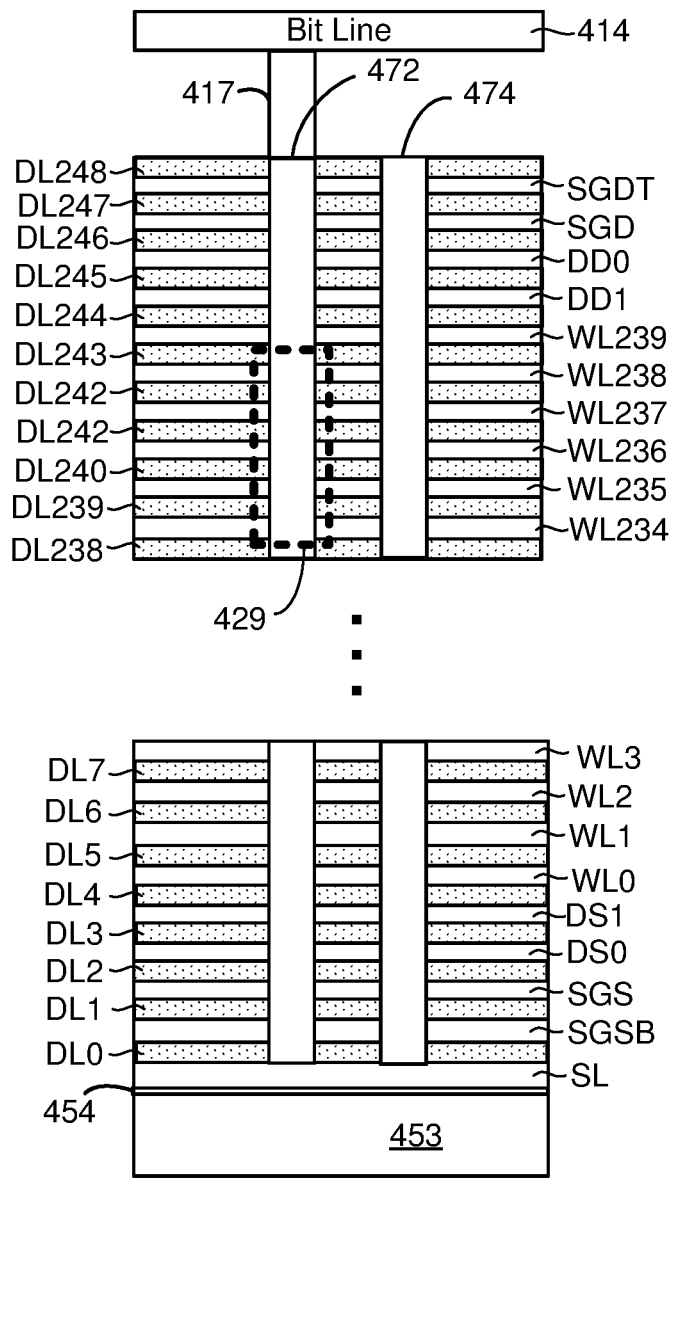
FIG. 4C depicts a cross sectional view of a portion of one embodiment of a block of memory cells.

FIG. 4C depicts a portion of one embodiment of a three dimensional memory structure 202 showing a cross-sectional view along line AA of FIG. 4B. This cross sectional view cuts through vertical columns (NAND strings) 472 and 474 of region 470 (see FIG. 4B). The structure of FIG. 4C includes two drain side select layers SGDT and SGD; two source side select layers SGS and SGSB; four dummy word line layers DD0, DD1, DS1 and DS0; two hundred and forty word line layers WL0-WL239 for connecting to data memory cells, and two hundred and forty non dielectric layers DL0-DL248. Other embodiments can implement more or less than the numbers described above for FIG. 4C.

Vertical columns 472 and 474 are depicted protruding through the drain side select layers, source side select layers, dummy word line layers and word line layers. In one embodiment, each vertical column comprises a vertical 3D NAND string. Below the vertical columns and the layers listed below is substrate 453, an insulating film 454 on the substrate, and source line SL. The NAND string of vertical column 442 has a source end at a bottom of the stack and a drain end at a top of the stack. As in agreement with FIG. 4B, FIG. 4C shows vertical column 442 connected to bit line 414 via connector 417.

For ease of reference, drain side select layers; source side select layers, dummy word line layers and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL248. For example, dielectric layers DL240 is above word line layer WL235 and below word line layer WL236. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WL0-W239 connect to memory cells (also called data memory cells). Dummy word line layers DD0, DD1, DS0 and DS1 connect to dummy memory cells. A dummy memory cell does not store and is not eligible to store host data (data provided from the host or entity outside of the storage system 100), such as data from a user of the host), while a data memory cell is eligible to store host data. Host data can be contrasted with system data that is generated by memory system 100 (e.g., L2P tables). In some embodiments, data memory cells and dummy memory cells may have a same structure. Drain side select layers SGDT and SGD are used to electrically connect and disconnect NAND strings from bit lines. Source side select layers SGSB and, SGS are used to electrically connect and disconnect NAND strings from the source line SL. As discussed below, in some embodiments, a block of memory cells is divided into sub-blocks and drain side select layers SGDT and SGD can be used to select a sub-block for a memory operation.

Note that the stack of word lines WL0-WL239 include two edge word lines at the edges of the stack, including top edge word line WL239 and bottom edge word line WL0. Word lines WL1-WL238 are non-edge word lines. The top edge word line WL239 is a last data word line at the drain side of data word lines and is, therefore, (in some embodiments) closest to the respective bit lines connected to the NAND strings (with respect to other data word lines). The bottom edge word line WL0 is a last data word line at the source side of data word lines and is, therefore, (in some embodiments) closest to the source line connected to the NAND strings (with respect to other data word lines).

FIG. 4D depicts a cross sectional view of region 429 of FIG. 4C that includes a portion of vertical column 472. In one embodiment, the vertical columns are round; however, in other embodiments other shapes can be used. In one embodiment, vertical column 472 includes an inner core layer 490 that is made of a dielectric, such as $SiO_2$. Other materials can also be used. Surrounding inner core 490 is polysilicon channel 491. Materials other than polysilicon can also be used. Note that it is the channel 491 that connects to the bit line and the source line. Surrounding channel 491 is a tunneling dielectric 492. In one embodiment, tunneling dielectric 492 has an ONO structure. Surrounding tunneling dielectric 492 is charge trapping layer 493, such as (for example) Silicon Nitride. Other memory materials and structures can also be used. The technology described herein is not limited to any particular material or structure.

FIG. 4D depicts dielectric layers DLL239, DLL240, DLL241, DLL242 and DLL243, as well as word line layers WLL234, WLL235, WLL236, WLL237, and WLL238. Each of the word line layers includes a word line region 496 surrounded by an aluminum oxide layer 497, which is surrounded by a blocking oxide layer 498. In other embodiments, the blocking oxide layer can be a vertical layer parallel and adjacent to charge trapping layer 493. The physical interaction of the word line layers with the vertical column forms the memory cells. Thus, a memory cell, in one embodiment, comprises channel 491, tunneling dielectric 492, charge trapping layer 493, blocking oxide layer 498, aluminum oxide layer 497 and word line region 496. For example, word line layer WLL238 and a portion of vertical column 472 comprise a memory cell MC1. Word line layer WL237 and a portion of vertical column 472 comprise a memory cell MC2. Word line layer WLL236 and a portion of vertical column 472 comprise a memory cell MC3. Word line layer WLL235 and a portion of vertical column 472 comprise a memory cell MC4. Word line layer WLL234 and a portion of vertical column 472 comprise a memory cell MC5. In other architectures, a memory cell may have a different structure; however, the memory cell would still be the storage unit.

When a memory cell is programmed, electrons are stored in a portion of the charge trapping layer 493 which is associated with (e.g. in) the memory cell. These electrons are drawn into the charge trapping layer 493 from the channel 491, through the tunneling dielectric 492, in response to an appropriate voltage on word line region 496. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as GIDL.

Figure 4E:
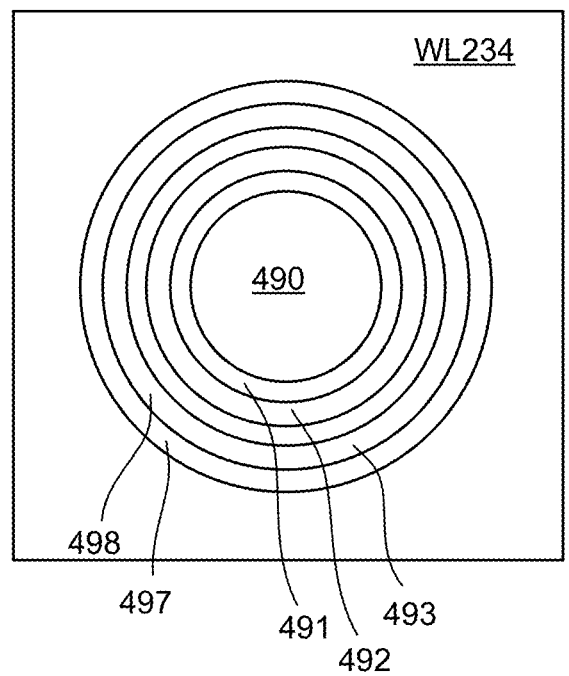
FIG. 4E depicts a cross section of as memory hole that implements a vertical NAND string.

FIG. 4E shows a cross section of vertical column 472 of FIG. 4D, cut through MC5. Thus, FIG. 4G depicts word line layer WL234, inner core 490, channel 491, tunneling dielectric 492, charge trapping layer 493, aluminum oxide layer 497, and blocking oxide layer 498.

Figure 4F:
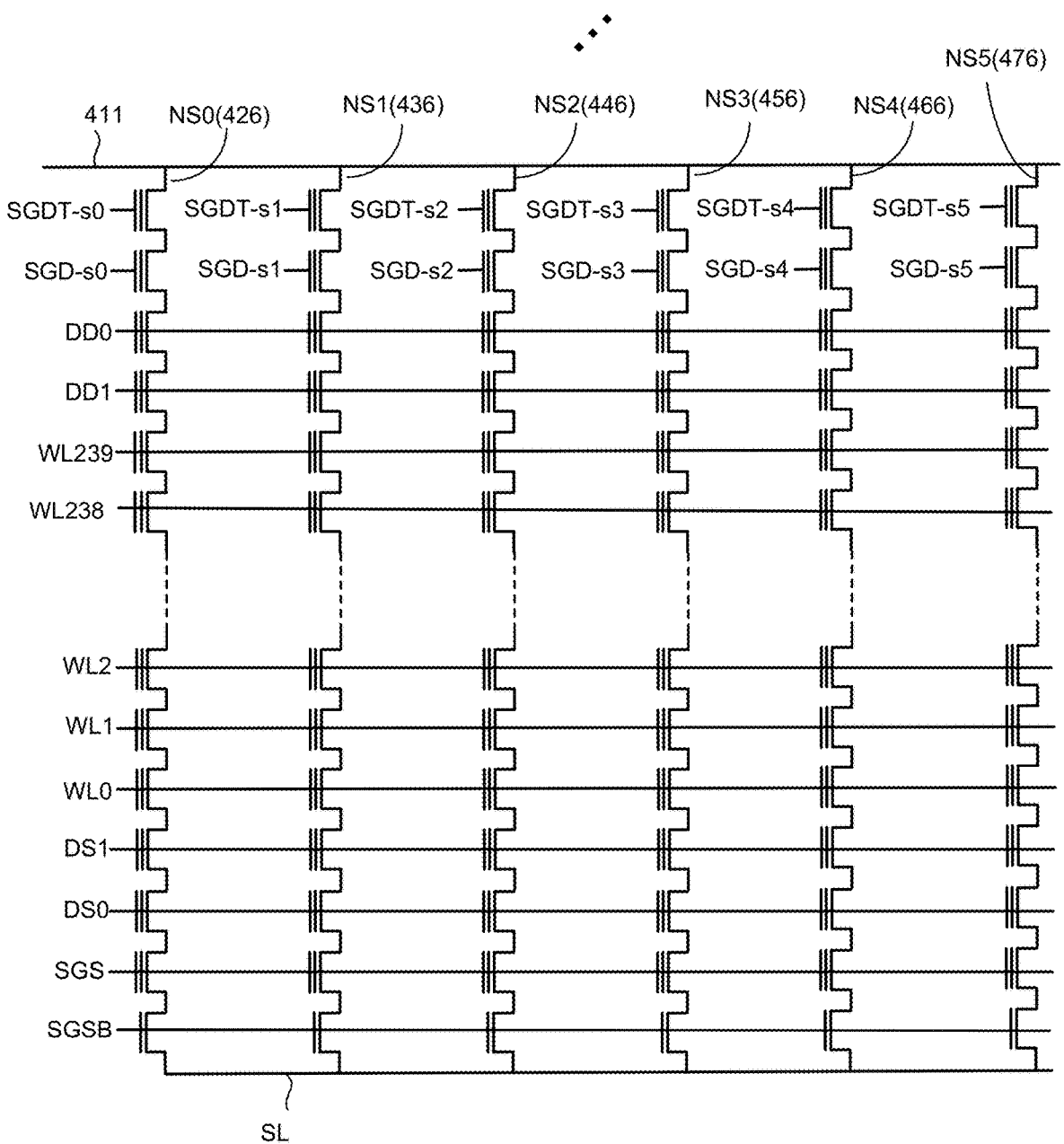
FIG. 4F is a schematic of a plurality of NAND strings in multiple sub-blocks of a same block.

FIG. 4F is a schematic diagram of a portion of the memory array 202 depicted in in FIGS. 4-4E. FIG. 4F shows physical data word lines WL0-WL239 running across the entire block. The structure of FIG. 4F corresponds to a portion 406 in Block 2 of FIG. 4A, including bit line 411. Within the block, in one embodiment, each bit line is connected to six NAND strings. Thus, FIG. 4F shows bit line connected to NAND string NS0 (which corresponds to vertical column 426), NAND string NS1 (which corresponds to vertical column 436), NAND string NS2 (which corresponds to vertical column 446), NAND string NS3 (which corresponds to vertical column 456), NAND string NS4 (which corresponds to vertical column 466), and NAND string NS5 (which corresponds to vertical column 476).

The SGD layer and SGDT layers are divided into separate select gates for each sub-block separated by isolation regions (480, 482, 484, 486 and 486) to form SGD-s0, SGD-s1, SGD-s2, SGD-s3, SGD-s4, and SGD-s5 for the SGD layer and SGDT-s0, SGDT-s1, SGDT-s2, SGDT-s3, SGDT-s4, and SGDT-s5 for the SGD layer. Although the select gates SGD-s0, SGD-s1, SGD-s2, SGD-s3, SGD-s4, and SGD-s5 are isolated from each other due to the isolation regions, the data word lines WL0-WL239 of each sub-block are connected together. The isolation regions (480, 482, 484, 486 and 486) are used to allow for separate control of sub-blocks. A first sub-block corresponds to those vertical NAND strings controlled by SGD-s0 and SGDT-s0. A second sub-block corresponds to those vertical NAND strings controlled by SGD-s1 and SGDT-s1. A third sub-block corresponds to those vertical NAND strings controlled by SGD-s2 and SGDT-s2. A fourth sub-block corresponds to those vertical NAND strings controlled by SGD-s3 and SGDT-s3. A fifth sub-block corresponds to those vertical NAND strings controlled by SGD-s4 and SGDT-s4. A sixth sub-block corresponds to those vertical NAND strings controlled by SGD-s5 and SGDT-s5. FIG. 4F only shows the NAND strings connected to bit line 411. However, a full schematic of the block would show every bit line and six vertical NAND strings connected to each bit line.

Although the example memories of FIGS. 4-4F are three dimensional memory structure that includes vertical NAND strings with charge-trapping material, other (2D and 3D) memory structures can also be used with the technology described herein.

Figure 5A:
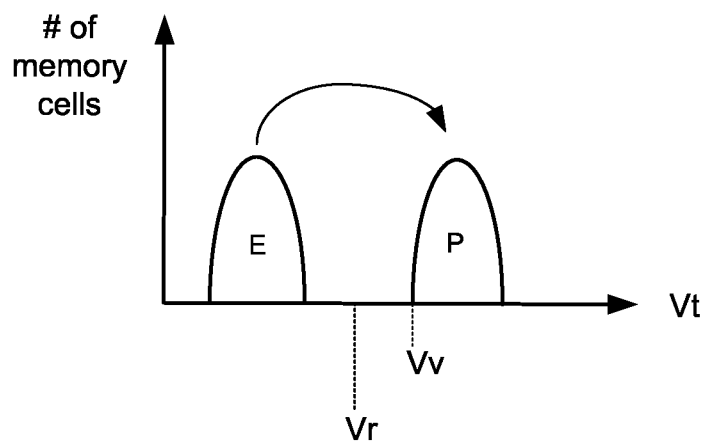
FIG. 5A depicts threshold voltage distributions.

The memory systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read reference voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv.

FIGS. 5B-F illustrate example threshold voltage distributions for the memory array when each memory cell stores multiple bit per memory cell data. Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores two bits of data. Other embodiments may use other data capacities per memory cell (e.g., such as three, four, five or six bits of data per memory cell).

Figure 5B:
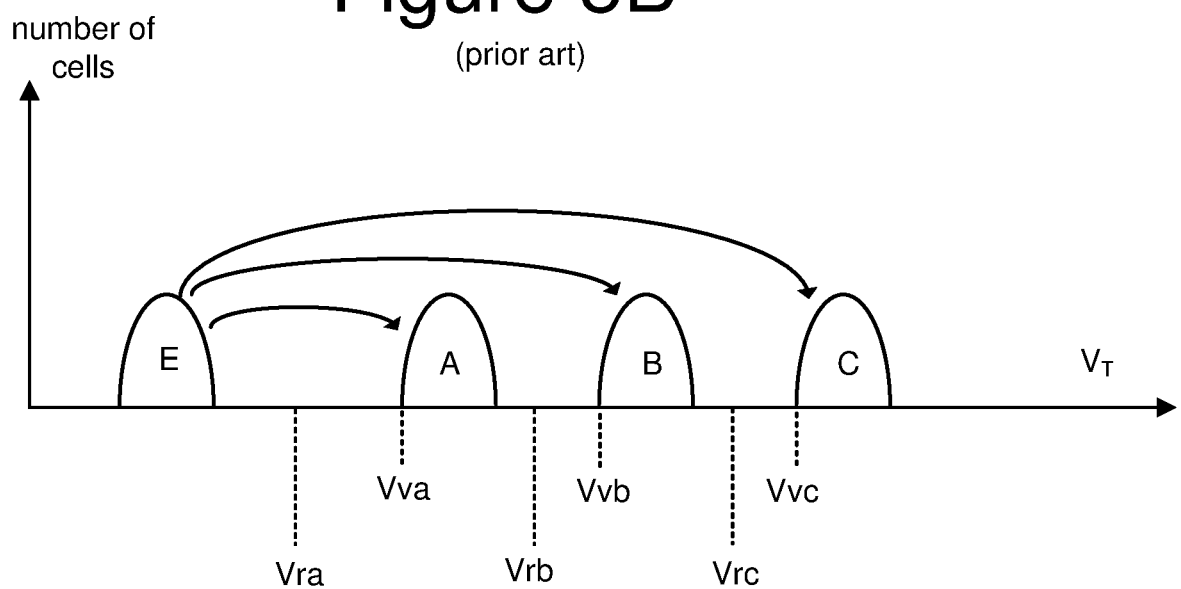
FIG. 5B depicts threshold voltage distributions.

FIG. 5B shows a first threshold voltage distribution E for erased memory cells. Three threshold voltage distributions A, B and C for programmed memory cells are also depicted. In one embodiment, the threshold voltages in the distribution E are negative and the threshold voltages in distributions A, B and C are positive. Each distinct threshold voltage distribution of FIG. 5B corresponds to predetermined values for the set of data bits. In one embodiment, each bit of data of the two bits of data stored in a memory cell are in different logical pages, referred to as a lower page (LP) and an upper page (UP). In other embodiments, all bits of data stored in a memory cell are in a common logical page. The specific relationship between the data programmed into the memory cell and the threshold voltage levels of the cell depends upon the data encoding scheme adopted for the cells. Table 1 provides an example encoding scheme.

TABLE 1

|    | E | A | B | C |
|----|---|---|---|---|
| LP | 1 | 0 | 0 | 1 |
| UP | 1 | 1 | 0 | 0 |

In one embodiment, known as full sequence programming, memory cells can be programmed from the erased data state E directly to any of the programmed data states A, B or C using the process of FIG. 6 (discussed below). For example, a population of memory cells to be programmed may first be erased so that all memory cells in the population are in erased data state E. Then, a programming process is used to program memory cells directly into data states A, B, and/or C. For example, while some memory cells are being programmed from data state E to data state A, other memory cells are being programmed from data state E to data state B and/or from data state E to data state C. The arrows of FIG. 5B represent the full sequence programming. In some embodiments, data states A-C can overlap, with memory controller 120 (or control die 211) relying on error correction to identify the correct data being stored.

Figure 5C:
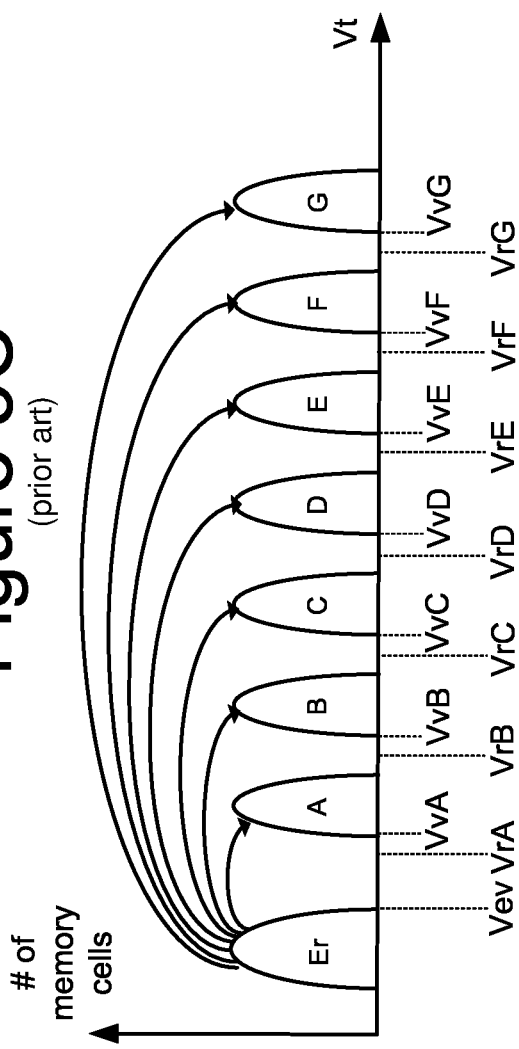
FIG. 5C depicts threshold voltage distributions.

FIG. 5C depicts example threshold voltage distributions for memory cells where each memory cell stores three bits of data per memory cells (which is another example of MLC data). FIG. 5C shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. Table 2 provides an example of an encoding scheme for embodiments in which each bit of data of the three bits of data stored in a memory cell are in different logical pages, referred to as a lower page (LP), middle page (MP) and an upper page (UP).

TABLE 2

|    | Er | A | B | C | D | E | F | G |
|----|----|---|---|---|---|---|---|---|
| UP | 1  | 1 | 1 | 0 | 0 | 0 | 0 | 1 |
| MP | 1  | 1 | 0 | 0 | 1 | 1 | 0 | 0 |
| LP | 1  | 0 | 0 | 0 | 0 | 1 | 1 | 1 |

FIG. 5C shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in.

FIG. 5C also shows seven verify reference voltages, VvA, VvB, VvC, VvD, VvE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 5C also shows Vev, which is a voltage level to test whether a memory cell has been properly erased.

In an embodiment that utilizes full sequence programming, memory cells can be programmed from the erased data state Er directly to any of the programmed data states A-G using the process of FIG. 6 (discussed below). For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state ER to data state A, other memory cells are being programmed from data state ER to data state B and/or from data state ER to data state C, and so on. The arrows of FIG. 5C represent the full sequence programming. In some embodiments, data states A-G can overlap, with control die 211 and/or memory controller 120 relying on error correction to identify the correct data being stored. Note that in some embodiments, rather than using full sequence programming, the system can use multi-pass programming processes known in the art.

In general, during verify operations and read operations, the selected word line is connected to a voltage (one example of a reference signal), a level of which is specified for each read operation (e.g., see read compare levels VrA, VrB, VrC, VrD, VrE, VrF, and VrG, of FIG. 5C) or verify operation (e.g. see verify target levels VvA, VvB, VvC, VvD, VvE, VvF, and VvG of FIG. 5C) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 5D:
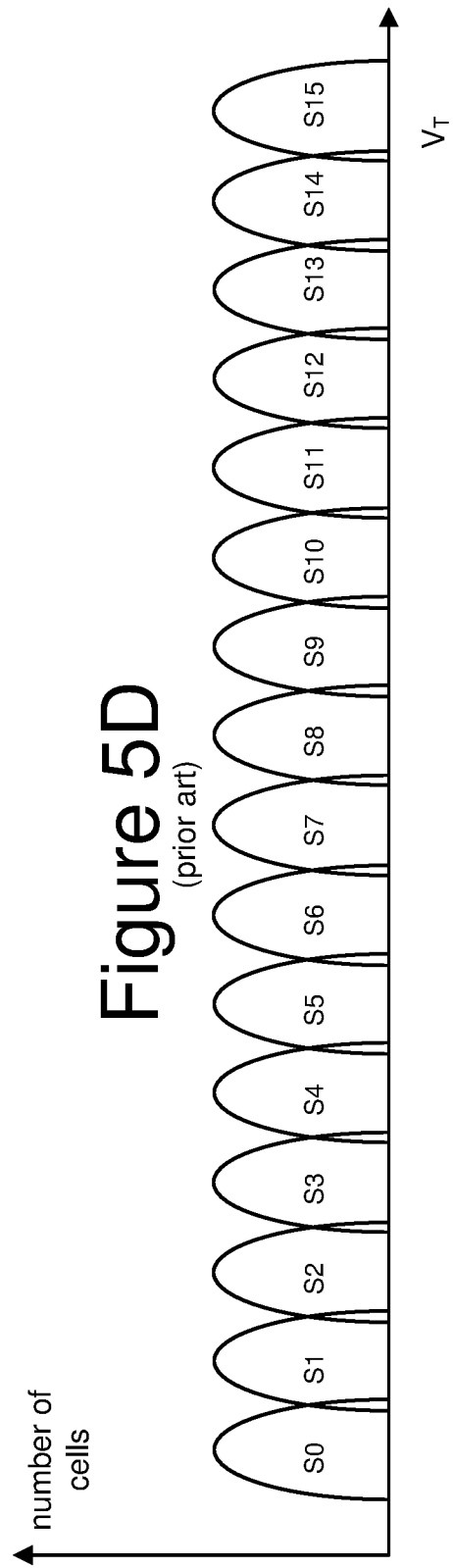
FIG. 5D depicts threshold voltage distributions.
Figure 5E:
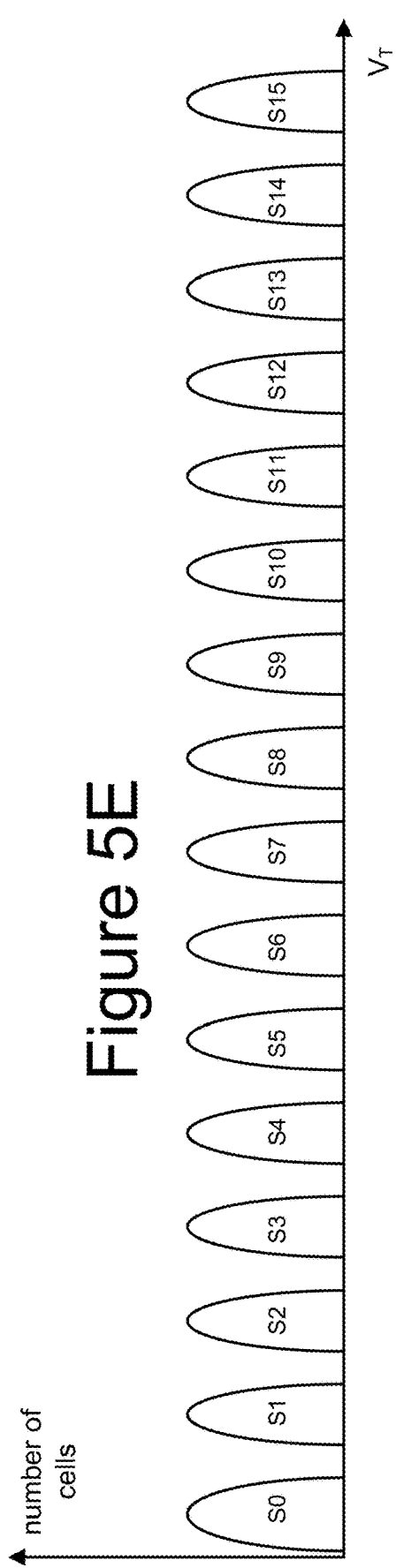
FIG. 5E depicts threshold voltage distributions.

FIG. 5D depicts threshold voltage distributions when each memory cell stores four bits of data, which is another example of MLC data. FIG. 5D depicts that there may be some overlap between the threshold voltage distributions (data states) S0-S15. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible. Changing the read reference voltages can help to mitigate such effects. Using ECC during the read process can fix errors and ambiguities. Note that in some embodiments, the threshold voltage distributions for a population of memory cells storing four bits of data per memory cell do not overlap and are separated from each other; for example, as depicted in FIG. 5E. The threshold voltage distributions of FIG. 5D will include read reference voltages and verify reference voltages, as discussed above.

When using four bits per memory cell, the memory can be programmed using the full sequence programming discussed above, or multi-pass programming processes known in the art. Each threshold voltage distribution (data state) of FIG. 5D corresponds to predetermined values for the set of data bits. The specific relationship between the data programmed into the memory cell and the threshold voltage levels of the cell depends upon the data encoding scheme adopted for the cells. Table 3 provides an example of an encoding scheme for embodiments in which each bit of data of the four bits of data stored in a memory cell are in different logical pages, referred to as a lower page (LP), middle page (MP), an upper page (UP) and top page (TP).

TABLE 3

|    | S0 | S1 | S2 | S3 | S4 | S5 | S6 | S7 | S8 | S9 | S10 | S11 | S12 | S13 | S14 | S15 |
|----|----|----|----|----|----|----|----|----|----|----|-----|-----|-----|-----|-----|-----|
| TP | 1  | 1  | 1  | 1  | 1  | 0  | 0  | 0  | 0  | 0  | 1   | 1   | 0   | 0   | 0   | 1   |
| UP | 1  | 1  | 0  | 0  | 0  | 0  | 0  | 0  | 1  | 1  | 1   | 1   | 1   | 1   | 0   | 0   |
| MP | 1  | 1  | 1  | 0  | 0  | 0  | 0  | 1  | 1  | 0  | 0   | 0   | 0   | 1   | 1   | 1   |
| LP | 1  | 0  | 0  | 0  | 1  | 1  | 0  | 0  | 0  | 0  | 0   | 1   | 1   | 1   | 1   | 1   |

Figure 5F:
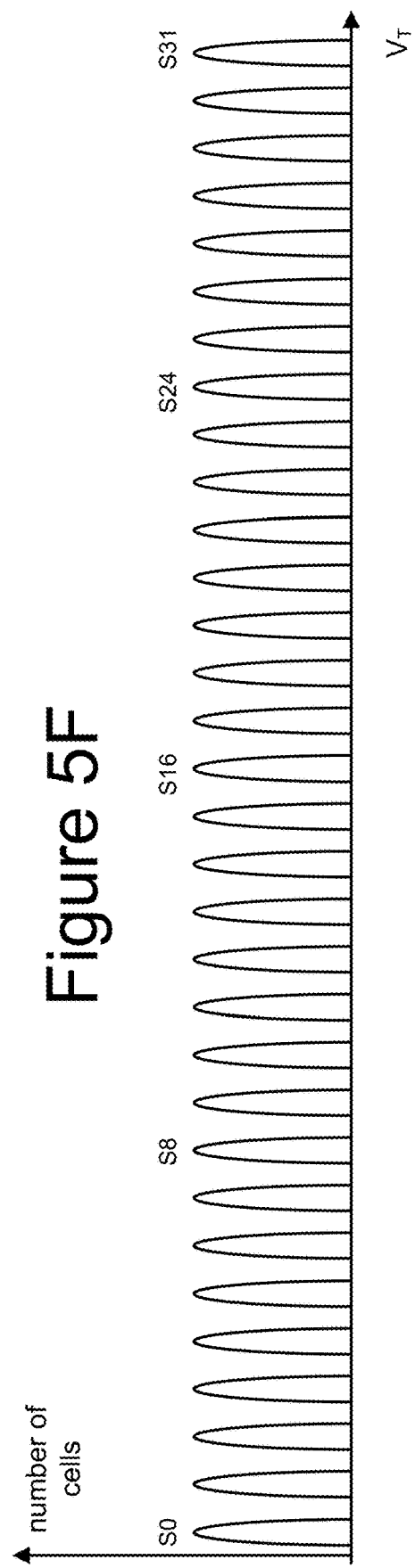
FIG. 5F threshold voltage distributions.

FIG. 5F depicts threshold voltage distributions when each memory cell stores five bits of data, which is another example of MLC data. In one example implementation, when memory cells store five bits of data, the data is stored in any of thirty two data state (e.g., S0-S31).

Figure 6:
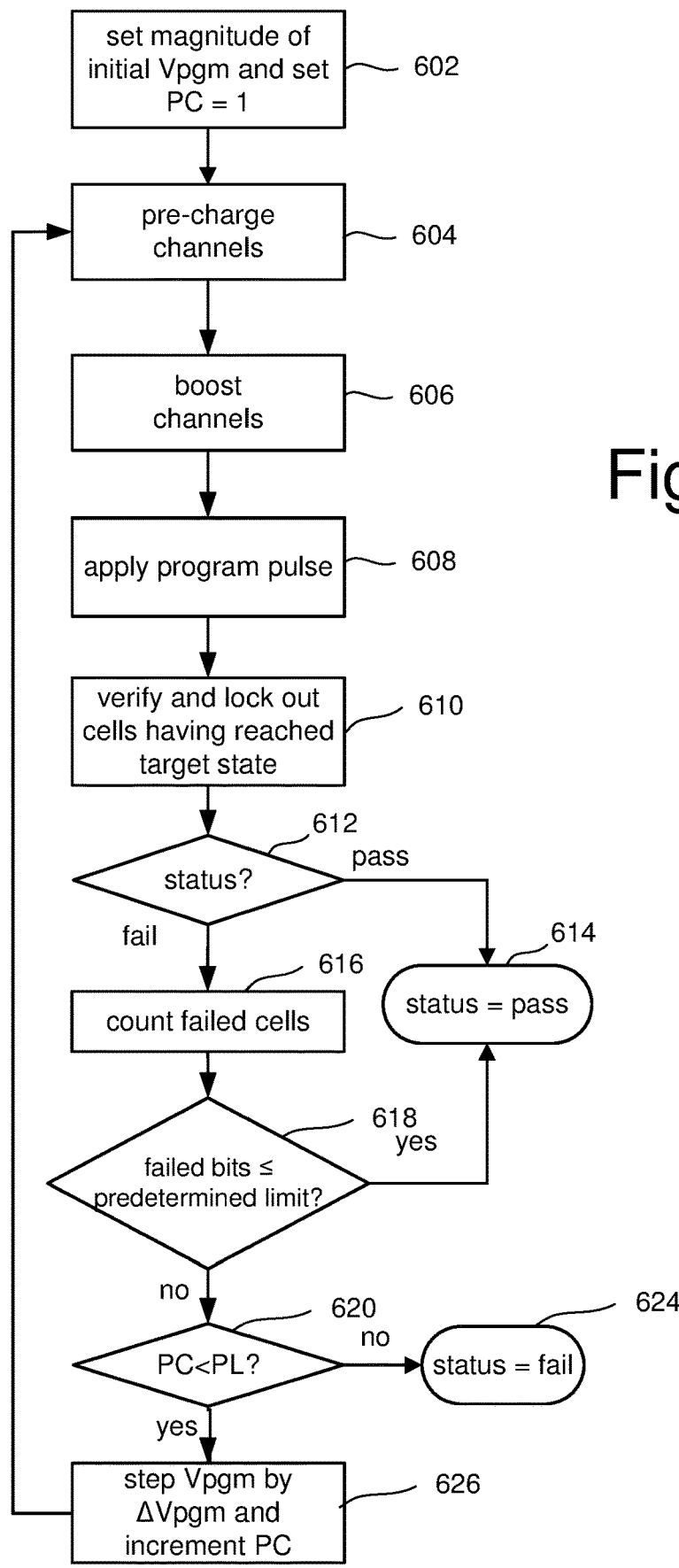
FIG. 6 is a flow chart describing one embodiment of a process for programming non-volatile memory.

FIG. 6 is a flowchart describing one embodiment of a process for programming memory cells. For purposes of this document, the term program and programming are synonymous with write and writing. In one example embodiment, the process of FIG. 6 is performed for memory array 202 using the one or more control circuits (e.g., system control logic 260, column control circuitry 210, row control circuitry 220 or a combination) discussed above. In one example embodiment, the process of FIG. 6 is performed by integrated memory assembly 207 using the one or more control circuits (e.g., system control logic 260, column control circuitry 210, row control circuitry 220 or a combination) of control die 211 to program memory cells on memory die 201. The process includes multiple loops, each of which includes a program phase and a verify phase. The process of FIG. 6 is performed to implement the full sequence programming, as well as other programming schemes including multi-pass programming. When implementing multi-pass programming, the process of FIG. 6 is used to implement any/each pass of the multi-pass programming process.

Typically, the program voltage applied to the control gates (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1.

In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting and remove stray charge from the channel, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts), also referred to as pass voltages, to perform boosting schemes. A program inhibit voltage is applied to the bit lines coupled the unselected NAND string. In one embodiment, for example, the channel is pre-charged to ~2 volts in step 604 and then floated. In step 606, the channel is boosted up from the 2 volts to a boosting voltage of approximately 8-10 volts.

In step 608, a program voltage pulse of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program verify is performed and memory cells that have reached their target states are locked out from further programming by the control die. Step 610 includes performing verification of programming by sensing at one or more verify reference levels. In one embodiment, the verification process is performed by testing whether the threshold voltages of the memory cells selected for programming have reached the appropriate verify reference voltage. In step 610, a memory cell may be locked out after the memory cell has been verified (by a test of the Vt) that the memory cell has reached its target state.

If, in step 612, it is determined that all of the memory cells have reached their target threshold voltages (pass), the programming process is complete and successful because all selected memory cells were programmed and verified to their target states. A status of "PASS" is reported in step 614. Otherwise, if in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 620 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process loops back to step 604 and another program pulse is applied to the selected word line (by the control die) so that another iteration (steps 604-626) of the programming process of FIG. 6 is performed.

In some embodiments, memory cells are programmed in an order from the source side to the drain side. For example, first the process of FIG. 6 is performed to program memory cells connected to WL0, followed by using the process of FIG. 6 to program memory cells connected to WL1, followed by using the process of FIG. 6 to program memory cells connected to WL2, followed by using the process of FIG. 6 to program memory cells connected to WL3, . . . followed by using the process of FIG. 6 to program memory cells connected to WL239.

In another embodiment, memory cells are programmed in an order from the drain side to the source side. For example, first the process of FIG. 6 is performed to program memory cells connected to WL239, followed by using the process of FIG. 6 to program memory cells connected to WL238, followed by using the process of FIG. 6 to program memory cells connected to WL237, followed by using the process of FIG. 6 to program memory cells connected to WL236, . . . followed by using the process of FIG. 6 to program memory cells connected to WL1, followed by using the process of FIG. 6 to program memory cells connected to WL0.

In one embodiment memory cells are erased prior to programming, and erasing is the process of changing the threshold voltage of one or more memory cells from a programmed data state to an erased data state. For example, changing the threshold voltage of one or more memory cells from state P to state E of FIG. 5A, from states A/B/C to state E of FIG. 5B, from states A-G to state Er of FIG. 5C or from states S1-S15 to state S0 of FIG. 5D.

One technique to erase memory cells in some memory devices is to bias a p-well (or other types of) substrate to a high voltage to charge up a NAND channel. An erase enable voltage (e.g., a low voltage) is applied to control gates of memory cells while the NAND channel is at a high voltage to erase the non-volatile storage elements (memory cells). Herein, this is referred to as p-well erase.

Another approach to erasing memory cells is to generate gate induced drain leakage (GIDL) current to charge up the NAND string channel. An erase enable voltage is applied to control gates of the memory cells, while maintaining the NAND string channel potential to erase the memory cells. Herein, this is referred to as GIDL erase. Both p-well erase and GIDL erase may be used to lower the threshold voltage (Vt) of memory cells.

In one embodiment, the GIDL current is generated by causing a drain-to-gate voltage at a select transistor (e.g., SGD and/or SGS). A transistor drain-to-gate voltage that generates a GIDL current is referred to herein as a GIDL voltage. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel, thereby raising potential of the channel. The other type of carriers, e.g., electrons, are extracted from the channel, in the direction of a bit line or in the direction of a source line, by an electric field. During erase, the holes may tunnel from the channel to a charge storage region of memory cells and recombine with electrons there, to lower the threshold voltage of the memory cells.

The GIDL current may be generated at either end of the NAND string. A first GIDL voltage may be created between two terminals of a select transistor (e.g., drain side select transistor) that is connected to or near a bit line to generate a first GIDL current. A second GIDL voltage may be created between two terminals of a select transistor (e.g., source side select transistor) that is connected to or near a source line to generate a second GIDL current. Erasing based on GIDL current at only one end of the NAND string is referred to as a one-sided GIDL erase. Erasing based on GIDL current at both ends of the NAND string is referred to as a two-sided GIDL erase.

As discussed above, the pre-charging step (e.g., step 604) during programming is performed to increase the voltage in the channel of unselected NAND strings in order to improve the subsequent boosting and to remove stray charge from the channel remaining from the previous verify operation (i.e., sometimes the verify operation can leave the channel at a slightly negative voltage). When programming memory cells from the source side to the drain side the pre-charging is often performed by injecting the pre-charge from the drain side (e.g., from the bit lines), while when programming memory cells from the drain side to the source side the pre-charging is often performed by injecting the pre-charge from the source side (e.g., from the source line).

Figure 7:
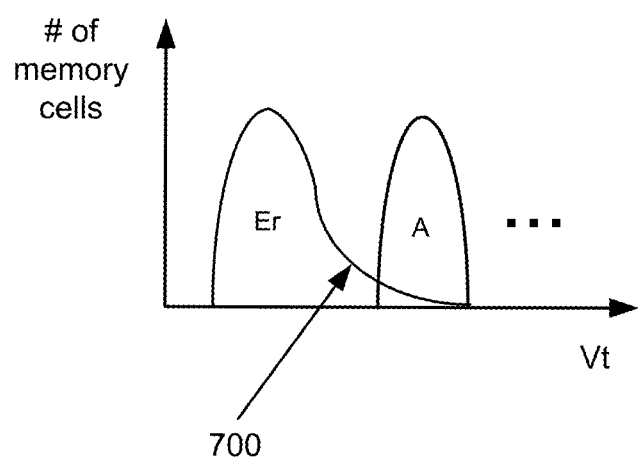
FIG. 7 depicts threshold voltage distributions.

One issue that has been observed when programming memory cells from the drain side to the source side and pre-charging from the source side is that an upper tail develops in the threshold voltage distribution for erased memory cells. For example, FIG. 7 shows example threshold voltage distribution Er for erased memory cells and example threshold voltage distribution A for memory cells programmed to data state A, for memory cells that store three bite of data per memory cell. The two example threshold voltage distributions depicted in FIG. 7 correspond to two of the eight threshold voltage distributions depicted in FIG. 5C. FIG. 7 shows an example of when an upper tail develops in the threshold voltage distribution for erased memory cells. For example, FIG. 7 includes an arrow 700 that points to the upper tail in the threshold voltage distribution for erased memory cells. The upper tail crosses into threshold voltage distribution A for memory cells programmed to data state A; therefore, when reading the data errors can occur. One reasons for the tail developing in the threshold voltage distribution for erased memory cells is due to program disturb. That is, while programming some memory cells to the programmed data states (e.g., A-G, S1-S15, etc.), some of the memory cells that were supposed to remain in the erased state erroneously received some programming because the respective unselected NAND strings for which those memory cells are connected to did not have their channels boosted to a high enough voltage during the boosting step (see e.g., step 606 of FIG. 6). One reason that the NAND strings did not have their channels boosted to a high enough voltage during the boosting step is that the pre-charging (see e.g., step 604 of FIG. 6) did not properly pre-charge the channels of those unselected NAND strings. The failure of the pre-charging tot properly pre-charge the channels can be explained in conjunction with FIG. 7A.

Figure 7A:
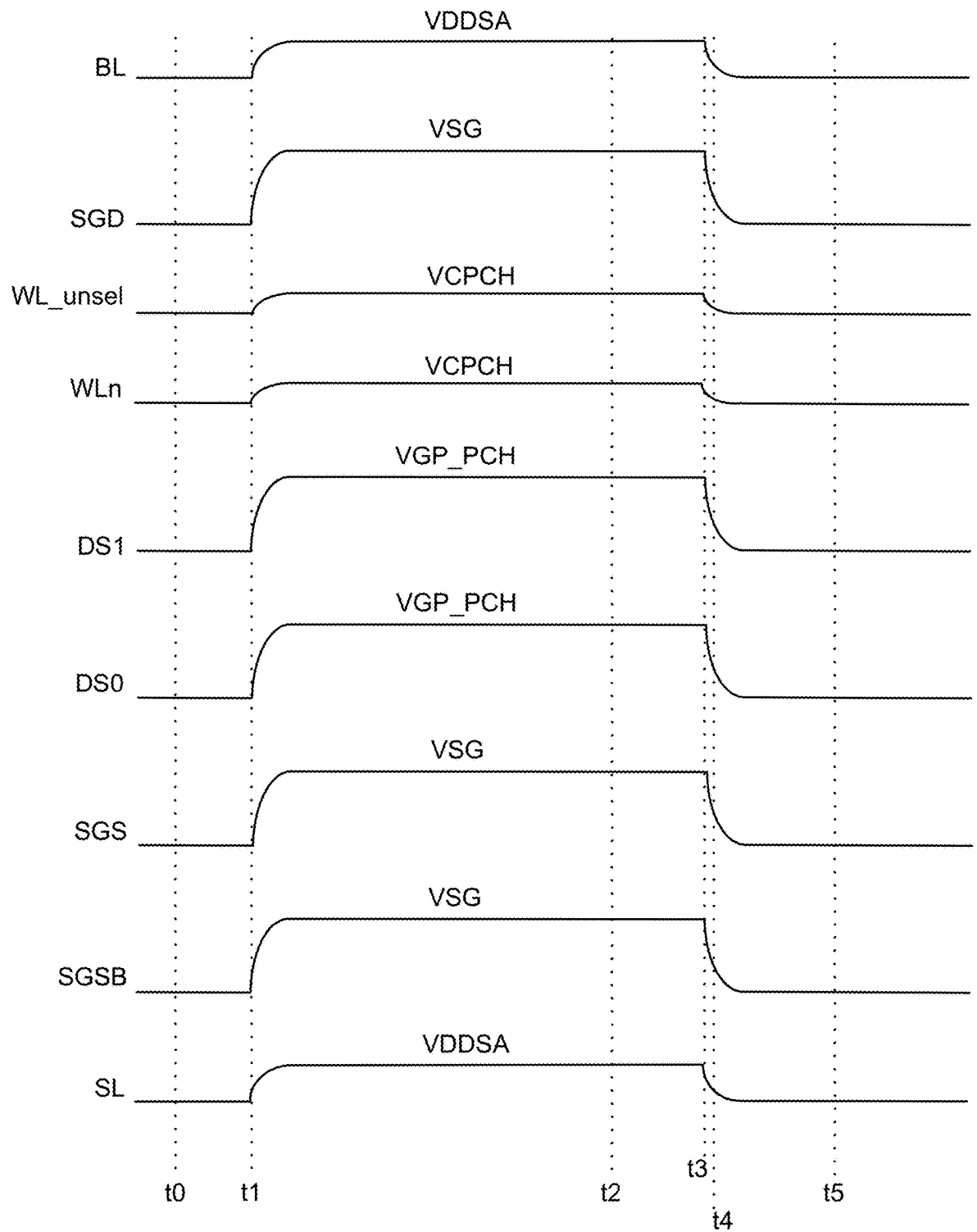
FIG. 7A is a timing diagram providing details of a process for pre-charging NAND strings as part of the programming process.

FIG. 7A is a timing diagram depicting the behavior of nine signals during the step of pre-charging (see e.g., step 604 of FIG. 6): BL, SGD, WL_unsel, WLn, DS1, DS0, SGS, SGSB and SL. The signal BL represent the bit line connected to unselected NAND strings (e.g., NAND strings for which none of their memory cells are to be programmed). The signal SGD is the drain side select line that is connected to the gate terminal of the drain side select gate transistor. For purposes of this example, the signals at SGD and SGDT are the same, so SGDT is omitted to simplify the drawing. The signal WL_unsel represents all of the unselected word lines. The signal WLn represents the selected word line. The signals DS1 and DS0 are dummy word lines. The signal SGS is the source side select line connected to the gate terminal of the source side selected gate transistor. The signal SGSB is the source side select line connected to the gate of the bottom source side selected gate transistor. The signal SL is the common source line. In one embodiment, one source line is connected to all NAND strings of a block (or a sub-block). In the example below, it is assumed that the selected word line is WL0 (the bottom or source side edge word line) and the order of programming is drain to source (e.g., WL239 to WL0), but in other embodiments the selected word line can be WL239 (the top or drain side edge word line), or another word line, and the order of programming is source to drain (or another order). Other selected word lines can also be used. FIG. 7A does not depict DD0 and DD1, as in one embodiment DD0 and DD1 will behave the same as WL_unsel or as DS1 or DS0.

At time t0, all of the signals depicted in FIG. 7A are at 0 volts (or close to 0 volts). At time t1, various voltages are applied to the signal lines depicted in FIG. 7A. For example, at time t1, the bit line BL is driven to VDDSA (e.g., ~2.5 volts), the drain side select line SGD is driven to VSG (e.g., ~6-8 volts), the data word lines (selected word line WLn and the unselected word lines WL_unsel) are driven to VCPCH (~1 volt), the dummy word lines are driven to VGP_PCH (e.g., ~6 volts), the source side select lines SGS and SGSB are driven to VSG, and the source line is driven to the pre-charge voltage VDDSA. The voltages VGP_PCH applied to the dummy word lines and VSG applied to the select lines SGS, SGSB, and SGD can be thought of as an activation voltages as they activate the dummy memory cells (e.g., cause the dummy memory cells to turn on) and activate the select gates (e.g., cause the select gates to turn on). At time t3, all of the signals depicted in FIG. 7A ramp down to 0 volts.

The process depicted in FIG. 7A is intended to pre-charge the channels of unselected NAND strings (e.g., NAND strings that are connected to the selected word line but whose memory cells are intended to be inhibited from programming). However, as explained with reference to FIGS. 7B, 7C and 7D, the pre-charging is not always successful when the order of programming is drain to source. Each of FIGS. 7B-7D depicts a portion of an unselected NAND string that is receiving the signals depicted in FIG. 7A. FIG. 7B shows the NAND string at time t2 of FIG. 7A, which corresponds to when the various depicted signals applied are at their steady state voltage. FIG. 7B shows that at t2 the pre-charge voltage VDDSA applied to the source line has been driven to pre-charge the channel of the NAND string underneath the source side select gates (connected to SGS and SGSB), the dummy memory cells (connected to DS1 and DS0) and the selected memory cell (connected to WLn)—see arrow 702. The unselected memory cells are cutoff due to being programmed to a threshold voltage greater than VCPCH. Thus, at time t2 the channel of the NAND string has been pre-charged to VDDSA, which is the goal of the pre-charging.

At time t3, all of the signals depicted in FIG. 7A start to ramp down to 0 volts. FIG. 7C shows the unselected NAND string at time t4, which is after the signals depicted in FIG. 7A start to ramp down to 0 volts and prior to signals depicted in FIG. 7A completing the ramp down to 0 volts. More specifically, time t4 represents the moment in time when the DS1, DS0, SGS and SGSB has reached VDDSA+Vtds1, where Vtds1 is the threshold voltage of the dummy memory cell connected to DS1. Without loss of generality, in one embodiment the threshold voltages of DS1, DS0, SGS, and SGSB are assumed identical (i.e. Vtds1=Vtds0=Vtsgs=Vtsgsb). At this point, the dummy memory cells connected to DS1 and DS0 and the source side select gates connected to SGS and SGSB are all cut off. The channel below the selected memory cell connected to WLn is still at VDDSA, but is floating and cut off from the source side and the drain side.

After time t4, when the gate voltages of DS1, DS0, SGS and SGSB further ramp down together, the channel potential below the selected memory cell connected to WLn will be coupled down to −Vtds1 (a negative voltage). Thus, the pre-charging for this situation resulted in the channel being at a negative voltage rather than a positive voltage. Having the channel at a negative voltage negatively impacts the subsequent boosting (e.g., at step 606 of FIG. 6). That is, the subsequent boosting is not likely to boost the channel as high as desired, which may lead to program disturb and an upper tail in the threshold voltage distribution for erased memory cells (e.g., see FIG. 7).

To address the above-described situation resulting in an upper tail in the threshold voltage distribution for erased memory cells, it is proposed to stagger the ramping down of voltages applied to the control lines on the source side of the selected word line (e.g., edge word line WL0). In one embodiment, these control lines on the source side of the selected word line include the dummy word lines (e.g., DS1 and DS0) and the source side select lines (e.g., SGS and SGSB). The staggering of voltages at the end of pre-charging serve to prevent program disturb and maintain narrow threshold voltage distributions for programmed memory cells in order to prevent errors in the data being stored.

FIG. 8 is a flow chart describing one embodiment of a process for pre-charging NAND strings as part of the programming process that includes the staggering of voltages at the end of pre-charging. In one embodiment, the process depicted in FIG. 8 is performed as part of step 604 of FIG. 6. In one example embodiment, the process of FIG. 8 is performed by any of the control circuits (e.g., system control logic 260, column control circuitry 210, row control circuitry 220 or a combination) discussed above. In one example embodiment, the process of FIG. 8 is performed by integrated memory assembly 207 using the one or more control circuits (e.g., system control logic 260, column control circuitry 210, row control circuitry 220 or a combination) of control die 211 to pre-charge channels of memory cells (e.g., NAND strings) on memory die 201. In one embodiment, the process of FIG. 8 is performed at the direction of state machine 262 (or another processor). The control circuit is connected to a set of control lines. The control lines are connected to a group of connected non-volatile memory cells (e.g., part of memory array 202). One example of a group of connected non-volatile memory cells is a NAND string; however, other groups can also be used. The control lines comprise word lines (e.g., WLn, WL_unsel, DS1, DS0, DD0, DD1) and select lines (e.g., SGDT, SGD, SGS, SGSB). The word lines include an edge word line (e.g., WL0 or WL239). The control lines include a first control line (e.g., DS1) next to the edge word line (e.g., WL0) and a second control line (e.g., DS0) next to the first control line. In step 802 of FIG. 8, the control circuit pre-charges the channel of the group of connected non-volatile memory cells by applying voltages to the control lines connected to the group of connected non-volatile memory cells. In step 804, the control circuit ramps down the voltages applied to the control lines for the pre-charging, including ramping down the first control line prior to ramping down the second control line. For example, DS1 can be ramped down prior to starting to ramp down DS0. Other control lines can also be ramped down in a staggered manner. The staggering of voltages at the end of pre-charging serve to prevent program disturb and maintain narrow threshold voltage distributions for programmed memory cells in order to prevent errors in the data being stored.

FIG. 9 is a flow chart describing another embodiment of a process for pre-charging NAND strings as part of the programming process that includes the staggering of voltages at the end of pre-charging. In one embodiment, the process depicted in FIG. 9 is performed as part of step 604 of FIG. 6. In one example embodiment, the process of FIG. 9 is performed by any of the control circuits (e.g., system control logic 260, column control circuitry 210, row control circuitry 220 or a combination) discussed above. In one example embodiment, the process of FIG. 9 is performed by integrated memory assembly 207 using the one or more control circuits (e.g., system control logic 260, column control circuitry 210, row control circuitry 220 or a combination) of control die 211 to pre-charge channels of memory cells (e.g., NAND strings) on memory die 201. In one embodiment, the process of FIG. 9 is performed at the direction of state machine 262 (or another processor). The control circuit is connected to a set of control lines. The control lines are connected to a group of connected non-volatile memory cells (e.g., part of memory array 202). One example of a group of connected non-volatile memory cells is a NAND string; however, other groups can also be used. The control lines comprise word lines (e.g., WLn, WL_unsel, DS1, DS0, DD0, DD1) and select lines (e.g., SGDT, SGD, SGS, SGSB). The word lines include an edge word line (e.g., WL0). The control lines include a first control line (e.g., DS1) next to the edge word line (e.g., WL0), a second control line (e.g., DS0) next to the first control line, a third control line (e.g., SGS) next to the second control line and a fourth control line (e.g., SGSB) next to the third control line. The process of FIG. 9 can be an example implementation of the process of FIG. 8. In step 902 of FIG. 9, the control circuit pre-charges the channel of the group of connected non-volatile memory cells by applying voltages to the control lines connected to the group of connected non-volatile memory cells. In step 904, the control circuit ramps down the voltages applied to the control lines for the pre-charging, including ramping down the first control line prior to ramping down the second control line, ramping down the second control line prior to ramping down the third control line, and ramping down the third control line prior to ramping down the fourth control line. For example, DS1 can be ramped down prior to ramping down DS0, DS0 can be ramped down prior to ramping down SGS, and SGS can be ramped down prior to ramping down SGSB. Other control lines can also be ramped down in a staggered manner. The staggering of voltages at the end of pre-charging serve to prevent program disturb and maintain narrow threshold voltage distributions for programmed memory cells in order to prevent errors in the data being stored.

FIG. 10 is a flow chart describing another embodiment of a process for pre-charging NAND strings as part of the programming process that includes the staggering of voltages at the end of pre-charging. In one embodiment, the process depicted in FIG. 10 is performed as part of step 604 of FIG. 6. In one example embodiment, the process of FIG. 10 is performed by any of the control circuits (e.g., system control logic 260, column control circuitry 210, row control circuitry 220 or a combination) discussed above. In one example embodiment, the process of FIG. 10 is performed by integrated memory assembly 207 using the one or more control circuits (e.g., system control logic 260, column control circuitry 210, row control circuitry 220 or a combination) of control die 211 to pre-charge channels of memory cells (e.g., NAND strings) on memory die 201. In one embodiment, the process of FIG. 10 is performed at the direction of state machine 262 (or another processor). The control circuit is connected to a set of control lines. The control lines are connected to multiple NAND strings (e.g., part of memory array 202). The control lines comprise word lines (e.g., WLn, WL_unsel, DS1, DS0, DD0, DD1) and select lines (e.g., SGDT, SGD, SGS, SGSB). The word lines include an edge word line (e.g., WL0). The control lines include a first control line (e.g., DS1) next to the edge word line and a second control line (e.g., DS0) next to the first control line. The process of FIG. 10 can be an example implementation of the process of FIG. 8.

In step 1002 of FIG. 10, the control circuit pre-charges channels of NAND strings connected to the common set of control lines by applying positive voltages to the control lines, the source line and the bit lines connected to the NAND strings. In one example, the common set of control lines include the signals WLn, WL_unsel, DS1, DS0, DD0, DD1, SGDT, SGD, SGS, and SGSB, described above. In step 1004, the control circuit ramps down the positive voltages applied to the control lines. In one embodiment, the ramping down of the control lines in step 1004 comprises: ramping down control lines on a first side of the edge word line in step 1042; ramping down the edge word line in step 1044; and performing a staggered ramp down of at least three control lines on a second side of the edge word line in step 1046. In one example embodiment, the edge word line is WL0, the control lines on a first side of the edge word line include WL1-WL239/DD1/DD0/SGD/SGDT, and control lines on a second side of the edge word line include DS1/DS0/SGS/SGSB. In another example embodiment, the edge word line is WL239, the control lines on a first side of the edge word line include WL0-WL238/DS1/DS0/SGS/SGSB, and control lines on a second side of the edge word line include DD1/DD0/SGD/SGDT. In one embodiment, the three control lines on the second side of the edge word line (see step 1046) comprise a first dummy word line (e.g., DS1) next to the edge word line (e.g., WL0), a second dummy word line (e.g., DS1) next to the first dummy word line, and a first source side select line (e.g., SGS) next to the second dummy word line.

Figure 11A:
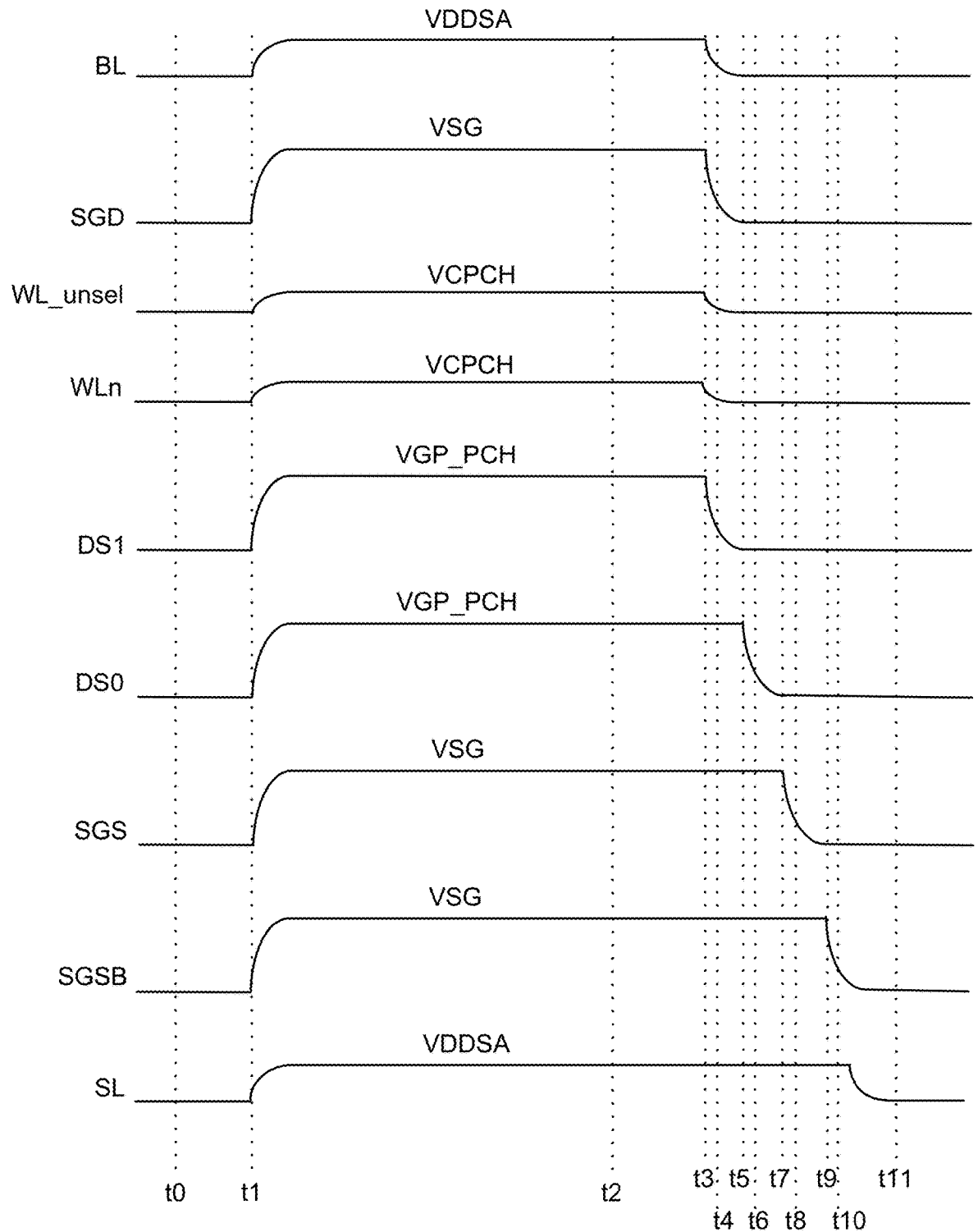
FIG. 11A is a timing diagram providing details of a process for pre-charging NAND strings as part of the programming process.

FIG. 11A is a timing diagram depicting the behavior of nine signals during the step of pre-charging (see e.g., step 604 of FIG. 6): BL, SGD, WL_unsel, WLn, DS1, DS0, SGS, SGSB and SL. FIG. 11A does not depict DD0 and DD1, as in one embodiment DD0 and DD1 will behave the same as WL_unsel, DS1 or DS0. In one example embodiment, the signals depicted in FIG. 11A are controlled by any of the control circuits discussed above. In one example embodiment, the process of FIG. 11A is performed by integrated memory assembly 207 using the one or more control circuits of control die 211 to pre-charge channels of memory cells (e.g., NAND strings) on memory die 201. In one embodiment, the process of FIG. 11A is performed at the direction of state machine 262 (or another processor). The process depicted in FIG. 11A is an example implementation of the processes of FIGS. 8, 9 and 10.

At time t0 of FIG. 11A, all of the signals depicted in FIG. 11A are at 0 volts (or close to 0 volts). At time t1 of FIG. 11A, various voltages are applied to the signal lines depicted in FIG. 11A. For example, at time t1, VDDSA is applied to the bit line BL, VSG is applied to the drain side select line SGD, VCPCH is applied to the data word lines (selected word line WLn and the unselected word lines WL_unsel), VGP_PCH is applied to the dummy word lines DS1 and DS0, VSG is applied to the source side select lines SGS and SGSB, and the pre-charge voltage VDDSA is applied to the source line SL. The time period t0-t2 of FIG. 11A corresponds to step 802 of FIG. 8, step 902 of FIG. 9 and step 1002 of FIG. 10.

At time t3 of FIG. 11A, the following signals ramp down to 0 volts: BL, SGD, WL_unsel, WLn and DS1. At time t5 of FIG. 11A, DS0 ramps down to 0 volts. At time t7 of FIG. 11A, SGS ramps down to 0 volts. At time t9 of FIG. 11A, SGSB ramps down to 0 volts. By time t11, all of the signals depicted in FIG. 11A have settled down to 0 volts. The time period from t3 to just before t5 corresponds to step 804 of FIG. 8. The time period from t3 to just before t9 corresponds to step 904 of FIG. 9. The time period from t3 to just before t5 corresponds to steps 1042 and 1044 of FIG. 10. The time period t3411 corresponds to step 1046 of FIG. 10.

FIG. 11A shows lowering the voltage on edge word line (e.g., WL0) and first dummy word line (e.g., DS1) during a first time period (e.g., from t3 until just before t5), lowering the voltage on the second dummy word line (e.g., DS0) during a second time period (e.g., from t5 until just before t7) that is after the first time period, lowering the voltage on the first source side select line (e.g., SGS) during a third time period (e.g., from t7 until just before t9) that is after the second time period, and lowering the voltage on the second source side select line (e.g., SGSB) during a fourth time period (e.g., from t9 until t11) that is after the third time period. The boosting of the channels of the unselected NAND strings and providing the program pulse are performed after the fourth time period.

The process depicted in FIG. 11A is intended to pre-charge the channels of unselected NAND strings (e.g., NAND strings that are connected to the selected word line but whose memory cells are intended to be inhibited from programming). As explained with reference to FIGS. 11B-E, due to the staggered ramp down of the voltages on the control lines, the pre-charging process depicted in FIG. 11A successfully pre-charges the channels to VDDSA such that the subsequent boosting of the channels (e.g., step 606 of FIG. 6) starts at VDDSA and boosts up to VDDSA+Vpass, where Vpass is the voltage applied to the unselected word lines WL_unsel during the boosting of the channels (e.g., step 606 of FIG. 6).

Each of FIGS. 11B-E depicts a portion of an unselected NAND string (e.g., intended to be inhibited from programming) that is receiving the signals depicted in FIG. 11A. FIG. 11B shows the NAND string at time t2 of FIG. 11A, which corresponds to when the various depicted signals applied are at their steady state voltage. FIG. 11B shows that at t2, the pre-charge voltage VDDSA applied to the source line has been driven (see arrow 1102) to pre-charge the channel of the NAND string underneath the source side select gates (connected to SGS and SGSB), the dummy memory cells (connected to DS1 and DS0) and the selected memory cell (connected to WLn). The unselected memory cells are cutoff due to being programmed to a threshold voltage greater than VCPCH. Thus, at time t2 the channel of the NAND string has been pre-charged to VDDSA, which is the goal of the pre-charging.

At time t3, a subset of the signals depicted in FIG. 11A start to ramp down to 0 volts. FIG. 11C shows the NAND string at time t4, which is after DS1 starts to ramp down to 0 volts and prior to DS1 completing the ramp down to 0 volts. More specifically, time t4 represents the moment in time when the DS1 reached VDDSA+Vtds1, where Vtds1 is the threshold voltage of the dummy memory cells connected to DS1. At this point in time, the dummy memory cells connected to DS1 are cut off; therefore, the portions of the channels under the memory cells connected to WLn are floating and are at VDDSA. However, since DS0, SGS and SGSB have not started ramping down, the dummy memory cells connected to DS0 and the select gates connected to SGS/SGSB are still conducting, the channels underneath the dummy memory cells connected to DS0 and the select gates connected to SGS/SGSB are still at VDDSA (see arrow 1104). As a result, VDDSA still drives the source side of the channel underneath the dummy memory cells connected to DS1 (e.g., leaky short channel device) so the channel potential holds at VDDSA.

At time t5 of FIG. 11A, DS0 starts to ramp down to 0 volts. FIG. 11D shows the NAND string at time t6, which is after DS0 starts to ramp down to 0 volts and prior to DS0 completing the ramp down to 0 volts. More specifically, time t6 represents the moment in time when the DS0 reached VDDSA+Vtds0, where Vtds0 is the threshold voltage of the dummy memory cells connected to DS0. At this point in time, the dummy memory cells connected to DS0 are cut off; therefore, the channel is cut off at DS0, and the portions of the channels under the memory cells connected to WLn are floating and are at VDDSA. However, since SGS and SGSB have not started ramping down, the select gates connected to SGS/SGSB are still conducting, and the channel underneath the select gates connected to SGS/SGSB are still at VDDSA (see arrow 1106). As a result, VDDSA still drives the source side of the channel underneath the dummy memory cells connected to DS0 (e.g., leaky short channel device) so the channel potential holds at VDDSA.

At time t7 of FIG. 11A, SGS starts to ramp down to 0 volts. FIG. 11E shows the NAND string at time t8, which is after SGS starts to ramp down to 0 volts and prior to SGS completing the ramp down to 0 volts. More specifically, time t8 represents the moment in time when the SGS reached VDDSA+Vtsgs, where Vtsgs is the threshold voltage of the select gates connected to SGS. At this point in time, the select gates connected to SGS are cut off; therefore, the channel is cut off at SGS, and the portions of the channels under the memory cells connected to WLn are still floating and are still at VDDSA. Since SGSB has not started ramping down, the select gates connected to SGSB are still conducting, and the channels underneath the select gates connected to SGSB are still at VDDSA (see arrow 1108). As a result, VDDSA still drives the source side of the channel underneath the select gates connected to SGS (e.g., leaky short channel device) so the channel potential holds at VDDSA.

At time t9 of FIG. 11A, SGSB starts to ramp down to 0 volts. FIG. 11F shows the NAND string at time t10, which is after SGSB starts to ramp down to 0 volts and prior to SGSB completing the ramp down to 0 volts. More specifically, time t10 represents the moment in time when the SGSB reached VDDSA+Vtsgsb, where Vtsgsb is the threshold voltage of the select gates connected to SGSB. At this point in time, the select gates connected to SGSB are cut off; therefore, the channel is cut off at SGSB, and the portions of the channels under the memory cells connected to WLn are still floating and are still at VDDSA. Since the source the source line SL is still at VDDSA then VDDSA is being driven at the source side of the select gates connected to SGSB, so the channel potential holds at VDDSA.

The source line ramps down to 0 volts after t10. By time t11 of FIG. 11A all of the signals depicts in FIG. 11A are at 0 volts and pre-charging is complete. FIG. 11G shows the NAND string at time t11. All of the memory cells and select gates are cut off; however, the channel underneath the memory cell connected to WLn is still at VDDSA and floating. When boosting of the channel subsequently begins, the boosting is helped by starting at VDDSA rather than 0.

Figure 12:
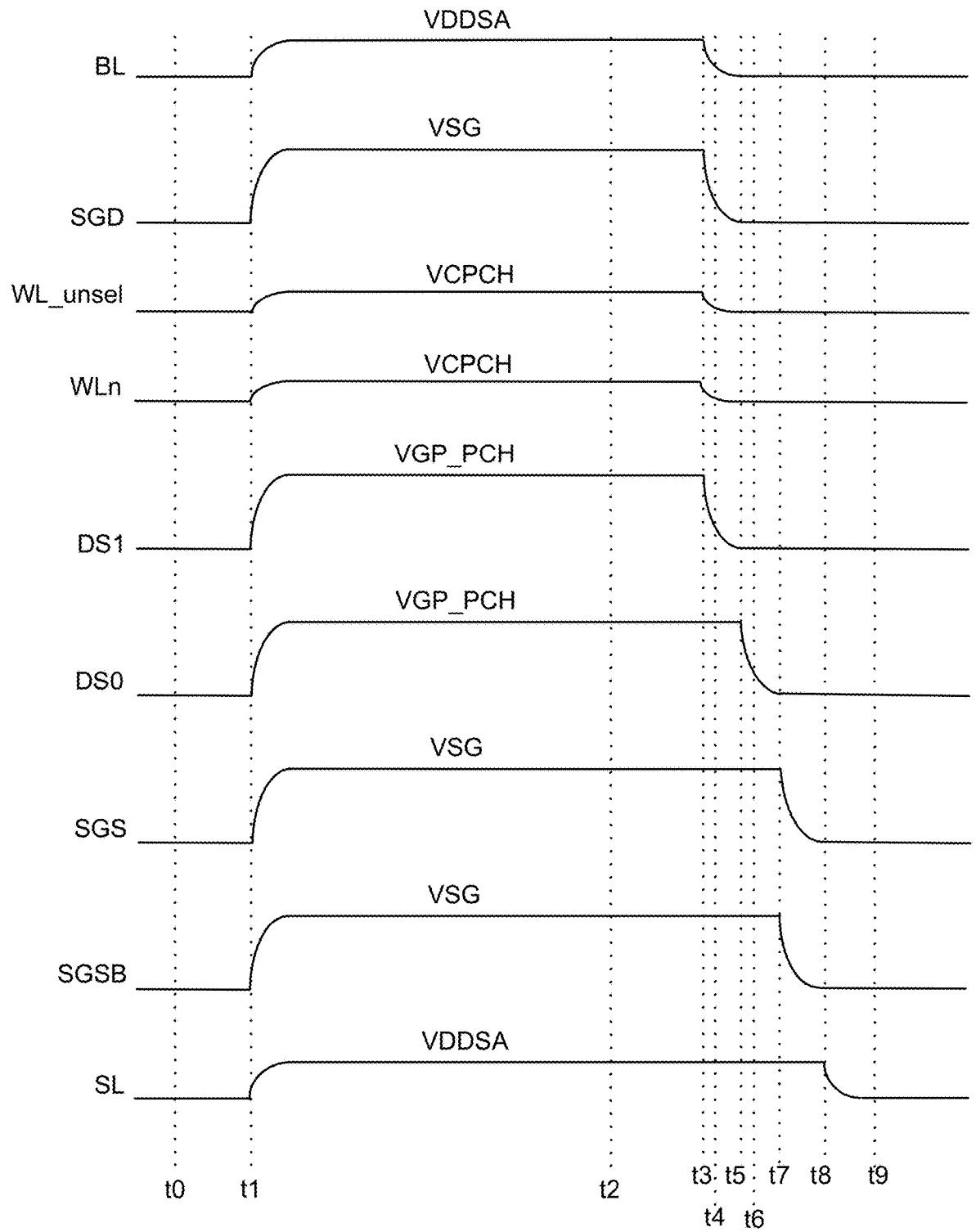
FIG. 12 is a timing diagram providing details of a process for pre-charging NAND strings as part of the programming process.

FIG. 12 is another embodiment of a timing diagram depicting the behavior of nine signals during the step of pre-charging (see e.g., step 604 of FIG. 6): BL, SGD, WL_unsel, WLn, DS1, DS0, SGS, SGSB and SL. In one example embodiment, the signals depicted in FIG. 12 are controlled by any of the control circuits discussed above. In one example embodiment, the process of FIG. 12 is performed by integrated memory assembly 207 using the one or more control circuits of control die 211 to pre-charge channels of memory cells (e.g., NAND strings) on memory die

201. In one embodiment, the process of FIG. 12 is performed at the direction of state machine 262 (or another processor). The process depicted in FIG. 12 is an example implementation of the processes of FIGS. 8, 9 and 10.

At time t0 of FIG. 12, all of the signals depicted in FIG. 12 are at 0 volts (or close to 0 volts). At time t1 of FIG. 12, various voltages are applied to the signal lines depicted in FIG. 12. For example, at time t1, VDDSA is applied to the bit line BL, VSG is applied to the drain side select line SGD, VCPCH is applied to the data word lines (selected word line WLn and the unselected word lines WL_unsel), VGP_PCH is applied to the dummy word lines, VSG is applied to the source side select lines SGS and SGSB, and the pre-charge voltage VDDSA is applied to the source line SL. The time period t0-t2 of FIG. 12 corresponds to step 802 of FIG. 8, step 902 of FIG. 9 and step 1002 of FIG. 10.

At time t3 of FIG. 12, the following signals ramp down to 0 volts: BL, SGD, WL_unsel, WLn and DS1. At time t5 of FIG. 12, DS0 ramps down to 0 volts. At time t7 of FIG. 12, SGS and SGSB ramp down to 0 volts. At time t8 of FIG. 12, the source line SL ramps down to 0 volts. By time t9, all of the signals depicted in FIG. 12 have settled down to 0 volts. The time period from t3 to just before t5 corresponds to step 804 of FIG. 8. The time period from t3 to just before t5 corresponds to steps 1042 and 1044 of FIG. 10. The time period t3-t8 corresponds to step 1046 of FIG. 10.

FIG. 12 depicts the lowering of the voltage on edge word line (e.g., WL0) and first dummy word line (e.g., DS1) during a first time period (e.g., from t3 until just before t5), lowering the voltage on the second dummy word line (e.g., DS0) during a second time period (e.g., from t5 until just before t7) that is after the first time period, lowering the voltage on the first source side select line (e.g., SGS) during a third time period (e.g., from t7 until just before t8) that is after the second time period, and lowering the voltage on the second source side select line (e.g., SGSB) during the same third time period as the first source side select line. The boosting of the channels of the unselected NAND strings and providing the program pulse are performed after t9. Due to the staggered ramp down of the voltages on the control lines, the pre-charging process depicted in FIG. 12 successfully pre-charges the channels to VDDSA such that the subsequent boosting of the channels (e.g., step 606 of FIG. 6) starts at VDDSA and boosts up to VDDSA+Vpass. The difference between the process of FIG. 11A and the process of FIG. 12 is the process of FIG. 11A staggers all of the control lines on the source side of the selected word line and the process of FIG. 12 staggers a subset of the control lines on the source side of the selected word line (e.g., in this example three of the four control lines are staggered). Note that FIGS. 11B, 11C and 11D apply to and explain the operation of the process of FIG. 12 in the same manner that those drawings apply to and explain the operation of the process of FIG. 11A.

A system has been disclosed that staggers the ramping down of voltages at the end of pre-charging in order to prevent program disturb and maintain narrow threshold voltage distributions for programmed memory cells in order to prevent errors in the data being stored.

Although many examples discussed above assume that the edge word line is positioned as a last data word line at a source side of data word lines (e.g., WL0), in some embodiments the edge word line is positioned as a last data word line at a drain side of data word lines (e.g., WL239).

One embodiment includes a non-volatile storage apparatus comprising: a group of connected non-volatile memory cells; control lines connected to the group of connected non-volatile memory cells, the control lines comprise word lines and select lines, the word lines include an edge word line, the control lines include a first control line next to the edge word line and a second control line next to the first control line; and a control circuit connected to the control lines, the control circuit is configured to pre-charge a channel of the group of connected non-volatile memory cells by applying voltages to the control lines, the control circuit is configured to ramp down the voltages applied to the control lines for the pre-charging including ramping down the first control line prior to ramping down the second control line.

One embodiment includes a method of operating non-volatile memory, comprising: pre-charging channels of NAND strings connected to a common set of control lines by applying positive voltages to the control lines and applying voltages to a source line and bit lines connected to the NAND strings, the control lines include word lines and select lines, the word lines include an edge word line; ramping down the positive voltages applied to the control lines, the ramping down comprising: ramping down control lines on a first side of the edge word line, ramping down the edge word line, and performing a staggered ramp down of at least three control lines on a second side of the edge word line; and applying a program voltage to the edge word line in order to program memory cells selected for programming that are connected to the edge word line and are part of a first subset of the NAND strings.

One embodiment includes a non-volatile storage apparatus, comprising: a plurality of NAND strings that each include a plurality of non-volatile memory cells; control lines connected to the NAND strings comprising a selected word line, unselected word lines, a first dummy word line next to the selected word line, a second dummy word line next to the first dummy word line, a first source side select line next to the second dummy word line, and a second source side select line next to the first source side select line; bit lines connected to the NAND strings; a source line connected to the NAND strings; and a control circuit connected to the control lines, the bit lines and the source line. The control circuit is configured to: apply a first vtage to the selected word line, apply a pre-charge voltage to the source line, apply one or more activation voltages to first dummy word line, second dummy word line, first source side select line and second source side select line to raise channel voltages for the NAND strings to a pre-charge voltage, lower the voltage on selected word line and first dummy word line during a first time period, lower the voltage on the second dummy word line during a second time period that is after the first time period, lower the voltage on the first source side select line during a third time period that is after the second time period, and lower the voltage on the second source side select line during a fourth time period that is after the third time period; boost the channels of the NAND strings after the fourth time period; and apply a program pulse to the selected word line after the fourth time period.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
a group of connected non-volatile memory cells;
control lines connected to the group of connected non-volatile memory cells, the control lines comprise data word lines and select lines, the data word lines include an edge word line, the edge word line is the last data word line at an end of the data word lines, the control lines include a first control line next to the edge word line and a second control line next to the first control line, the first control line and the second control line are not data word lines; and
a control circuit connected to the control lines, the control circuit is configured to pre-charge a channel of the group of connected non-volatile memory cells by applying voltages to the control lines, the control circuit is configured to ramp down the voltages applied to the control lines for the pre-charging including ramping down the first control line prior to ramping down the second control line.

2. The non-volatile storage apparatus of claim 1, wherein:
the control lines further include a third control line next to the second control line, the third control line is not a data word line; and
the control circuit is configured to ramp down the voltages applied to the control lines for the pre-charging including ramping down the first control line prior to ramping down the second control line and ramping down the second control line prior to ramping down the third control line.

3. The non-volatile storage apparatus of claim 1, wherein:
the control lines further include a third control line next to the second control line;
the control lines further include a fourth control line next to the third control line, the third control line and the fourth control line are not data word lines; and
the control circuit is configured to ramp down the voltages applied to the control lines for the pre-charging including ramping down the first control line prior to ramping down the second control line, ramping down the second control line prior to ramping down the third control line and ramping down the third control line prior to ramping down the fourth control line.

4. The non-volatile storage apparatus of claim 3, wherein:
the first control line is a first dummy word line;
the second control line is a second dummy word line;
the third control line is a first source side select line; and
the fourth control line is a second source side select line.

5. The non-volatile storage apparatus of claim 3, further comprising:
a source line connected to the group of connected word lines; and
a bit line connected to the group of connected word lines, the control circuit is further configured to apply a pre-charge voltage to the source line to pre-charge the channel to the pre-charge voltage and maintain the channel at the pre-charge voltage until after ramping down the voltages applied to the control lines for the pre-charging.

6. The non-volatile storage apparatus of claim 5, wherein:
the control lines further include a third control line next to the second control line;
the control lines further include a fourth control line next to the third control line, the third control line and the fourth control line are not data word lines;
the control circuit is configured to ramp down the voltages applied to the control lines for the pre-charging including ramping down the first control line prior to ramping down the second control line, ramping down the second control line prior to ramping down the third control line and ramping down the third control line concurrently with ramping down the fourth control line;
the edge word line is a last data word line to be programmed for data word lines connected to the group of connected non-volatile memory cells; and
the edge word line is positioned as a last data word line at a source side of data word lines connected to the group of connected non-volatile memory cells.

7. The non-volatile storage apparatus of claim 1, wherein:
the control circuit is further configured to boost the channel of the group of connected non-volatile memory cells subsequent to the pre-charging of the channel in order to prevent programming of a memory cell of the group of connected non-volatile memory cells that is connected to the edge word line.

8. The non-volatile storage apparatus of claim 7, wherein:
the control circuit is further configured to apply a program pulse to the edge word line subsequent to the pre-charging of the channel.

9. The non-volatile storage apparatus of claim 1, wherein:
the control circuit is further configured to program the memory cells of the group of connected non-volatile memory cells in an order from a drain side to a source side of the group of connected non-volatile memory cells; and
the edge word line is a last data word line to be programmed for data word lines connected to the group of connected non-volatile memory cells.

10. The non-volatile storage apparatus of claim 1, wherein:
the edge word line is positioned as a last data word line at a source side of data word lines connected to the group of connected non-volatile memory cells.

11. The non-volatile storage apparatus of claim 1, wherein:
the group of connected non-volatile memory cells is a NAND string; and the channel subjected to the pre-charging of the channel includes a portion of the channel of the NAND string at the non-volatile memory cell connected to the edge word line.

12. The non-volatile storage apparatus of claim 1, wherein:
the group of connected non-volatile memory cells is a three dimensional NAND string having a charge trapping layer; and
the channel subjected to the pre-charging of the channel includes a portion of the channel of the NAND string at the non-volatile memory cell connected to the edge word line.

13. A method of operating non-volatile memory, comprising:
pre-charging channels of NAND strings connected to a common set of control lines by applying positive voltages to the control lines and applying voltages to a source line and bit lines connected to the NAND strings, the control lines include data word lines and select lines, the data word lines include an edge word line, the edge word line is the last data word line at an end of the data word lines;
ramping down the positive voltages applied to the control lines, the ramping down comprising:
ramping down data word lines on a first side of the edge word line,
ramping down the edge word line, and
performing a staggered ramp down of at least three control lines on a second side of the edge word line by first ramping down a first control line on the second side of the edge word line followed by ramping down a second control line on the second side of the first control line followed by ramping down a third control line on the second side of the second control line; and
applying a program voltage to the edge word line in order to program memory cells selected for programming that are connected to the edge word line and are part of a first subset of the NAND strings.

14. The method of claim 13, further comprising:
boosting channels from a pre-charge voltage associated with the pre-charging to a boosting voltage for NAND strings of a second subset of the NAND strings that are to be inhibited from programming, there are no data word lines on the second side of the edge word line.

15. The method of claim 13, wherein:
the three control lines on the second side of the edge word line comprise a first dummy word line next to the edge word line, a second dummy word line next to the first dummy word line, and a first source side select line next to the second dummy word line.

16. The method of claim 15, wherein:
the performing the staggered ramp down comprises:
lowering the voltage on the edge word line and first dummy word line during a first time period,
lowering the voltage on the second dummy word line during a second time period that is after the first time period, and
lowering the voltage on the first source side select line during a third time period that is after the second time period.

17. The method of claim 13, wherein:
the at least three control lines on a second side of the edge word line comprise a first dummy word line next to the edge word line, a second dummy word line next to the first dummy word line, a first source side select line next to the second dummy word line, and a second source side select line next to the first source side select line; and
the performing the staggered ramp down comprises:
lowering the voltage on edge word line and first dummy word line during a first time period,
lowering the voltage on the second dummy word line during a second time period that is after the first time period,
lowering the voltage on the first source side select line during a third time period that is after the second time period, and
lowering the voltage on the second source side select line during a fourth time period that is after the third time period.

18. The method of claim 13, wherein:
the edge word line is connected to non-volatile memory cells of the NAND strings that are closest to a source line connected to the NAND strings, with respect to other non-volatile memory cells of the NAND strings.

19. A non-volatile storage apparatus, comprising:
a plurality of NAND strings that each include a plurality of non-volatile memory cells;
control lines connected to the NAND strings comprising a selected word line, unselected word lines, a first dummy word line next to the selected word line, a second dummy word line next to the first dummy word line, a first source side select line next to the second dummy word line, and a second source side select line next to the first source side select line;
bit lines connected to the NAND strings;
a source line connected to the NAND strings; and
a control circuit connected to the control lines, the bit lines and the source line;
the control circuit is configured to:
apply a first voltage to the selected word line,
apply a pre-charge voltage to the source line,
apply one or more activation voltages to first dummy word line, second dummy word line, first source side select line and second source side select line to raise channel voltages for the NAND strings to a pre-charge voltage,
lower the voltage on selected word line and first dummy word line during a first time period,
lower the voltage on the second dummy word line during a second time period that is after the first time period,
lower the voltage on the first source side select line during a third time period that is after the second time period, and
lower the voltage on the second source side select line during a fourth time period that is after the third time period,
boost the channels of the NAND strings after the fourth time period, and
apply a program pulse to the selected word line after the fourth time period.

20. The non-volatile storage apparatus of claim 19, wherein:
the selected word line is a source side edge word line; and
the plurality of NAND strings are inhibited from programming.

* * * * *